(12) United States Patent
Nakatsuka et al.

(10) Patent No.: US 7,161,197 B2
(45) Date of Patent: Jan. 9, 2007

(54) RF SWITCHING CIRCUIT FOR USE IN MOBILE COMMUNICATION SYSTEMS

(75) Inventors: Tadayoshi Nakatsuka, Osaka (JP); Shinji Fukumoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/134,333

(22) Filed: May 23, 2005

(65) Prior Publication Data
US 2005/0263799 A1    Dec. 1, 2005

(30) Foreign Application Priority Data
May 31, 2004   (JP)   ............................. 2004-161222

(51) Int. Cl.
*H01L 29/76*   (2006.01)
(52) U.S. Cl. ............................. 257/270; 257/E29.319
(58) Field of Classification Search ................ 257/266, 257/270, E29.319
See application file for complete search history.

(56) References Cited

U.S. PATENT DOCUMENTS

2004/0026742 A1*   2/2004   Nakatsuka et al. ......... 257/368

FOREIGN PATENT DOCUMENTS

JP   2000-183362 A   6/2000

\* cited by examiner

*Primary Examiner*—Thomas L. Dickey
(74) *Attorney, Agent, or Firm*—McDermott Will & Emery LLP

(57) ABSTRACT

An RF switching circuit according to the present invention includes: a plurality of input/output terminals for inputting and outputting an RF signal; and a switch for opening and closing an electrical connection between the input/output terminals. The switch is constituted by a multi-gate field effect transistor including a plurality of gates located between source and drain spaced from each other on a semiconductor layer. A bias voltage is applied to an inter-gate region of the semiconductor layer between the gates. The bias voltage is equal to or lower than 90% of a high-level voltage, which is a voltage for turning the multi-gate field effect transistor ON, in a state where the multi-gate field effect transistor is ON, and is equal to or higher than 80% of the high-level voltage and equal to or lower than the high-level voltage in a state where the multi-gate field effect transistor is OFF.

3 Claims, 17 Drawing Sheets

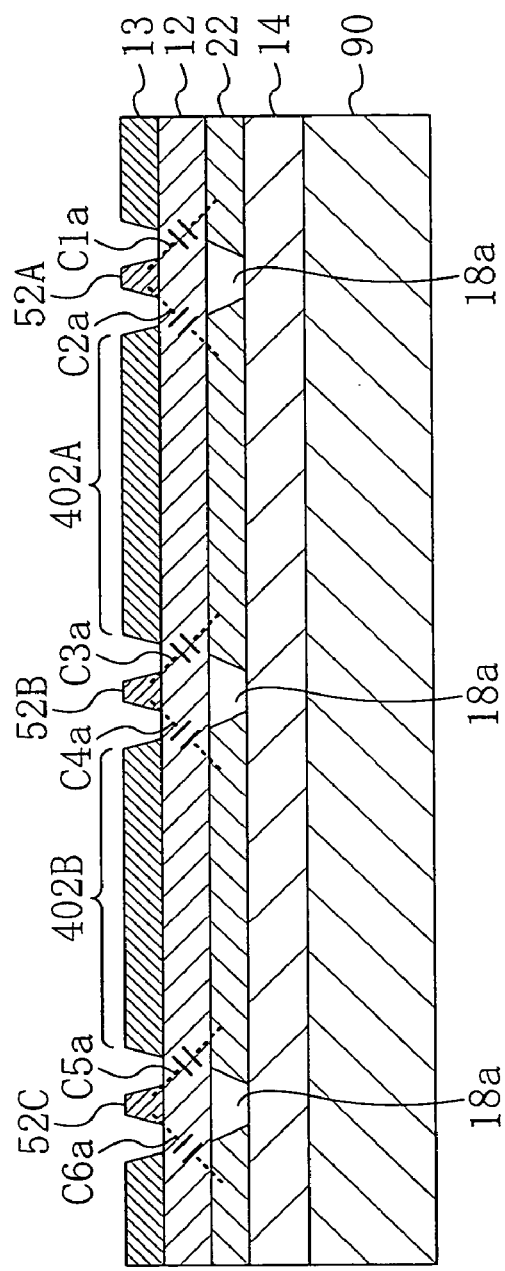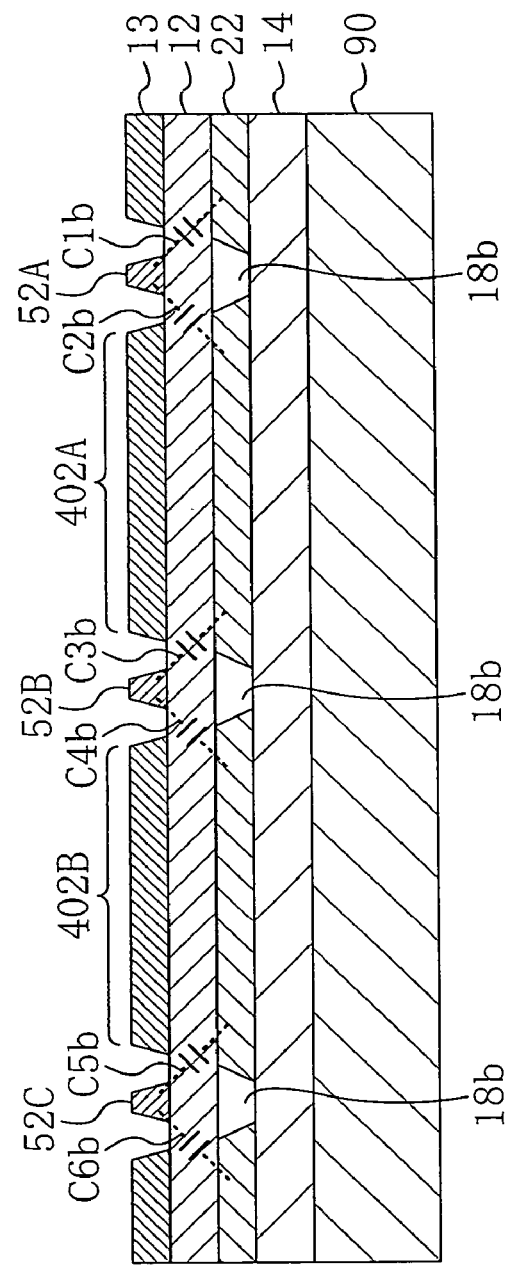
FIG. 3A
FIG. 3B

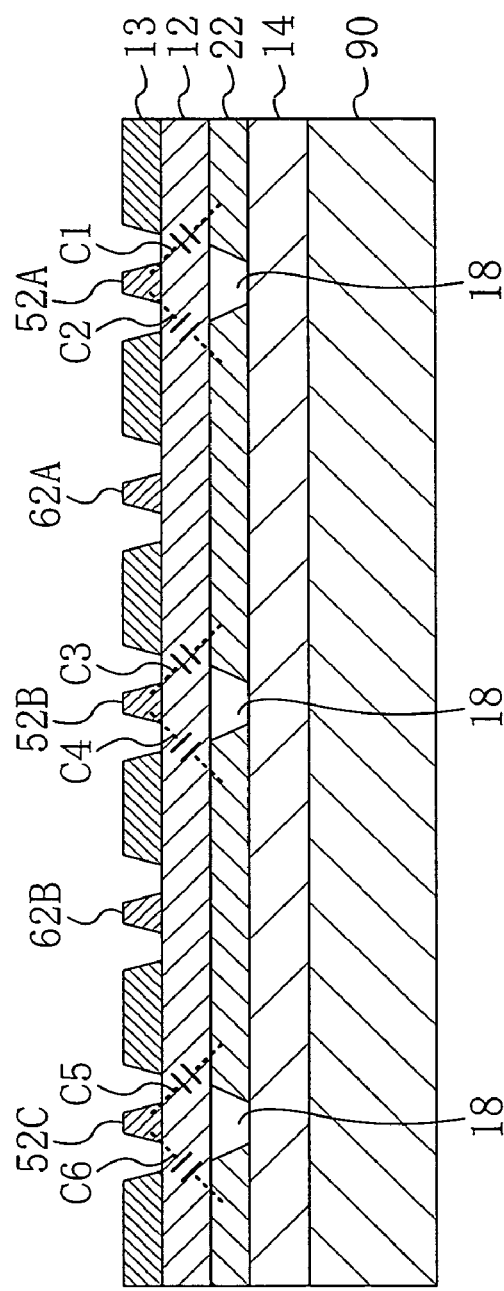
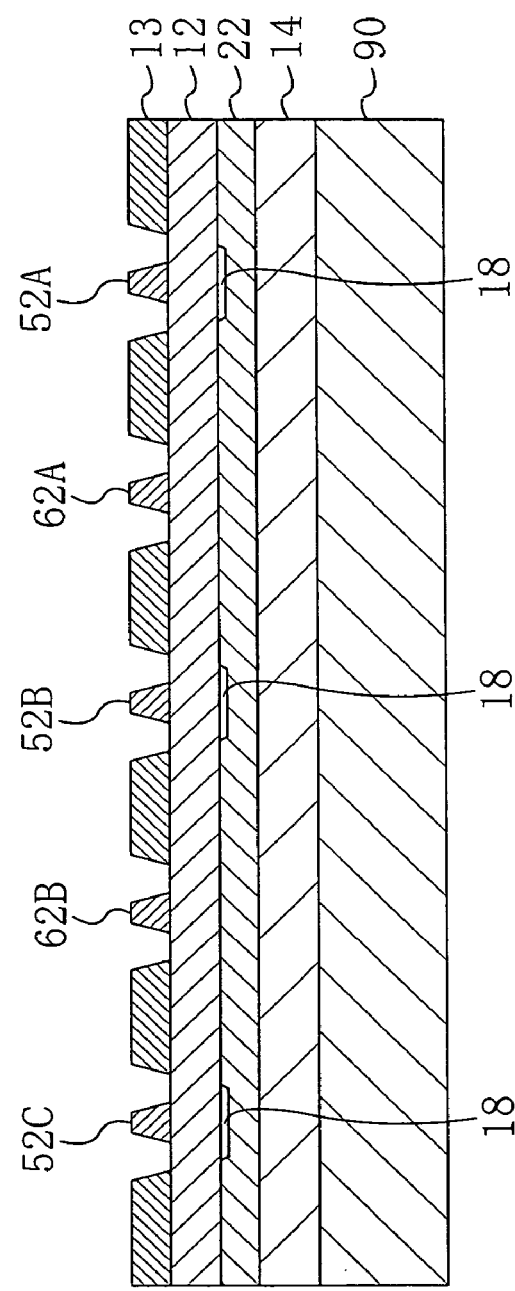
FIG. 10A
FIG. 10B

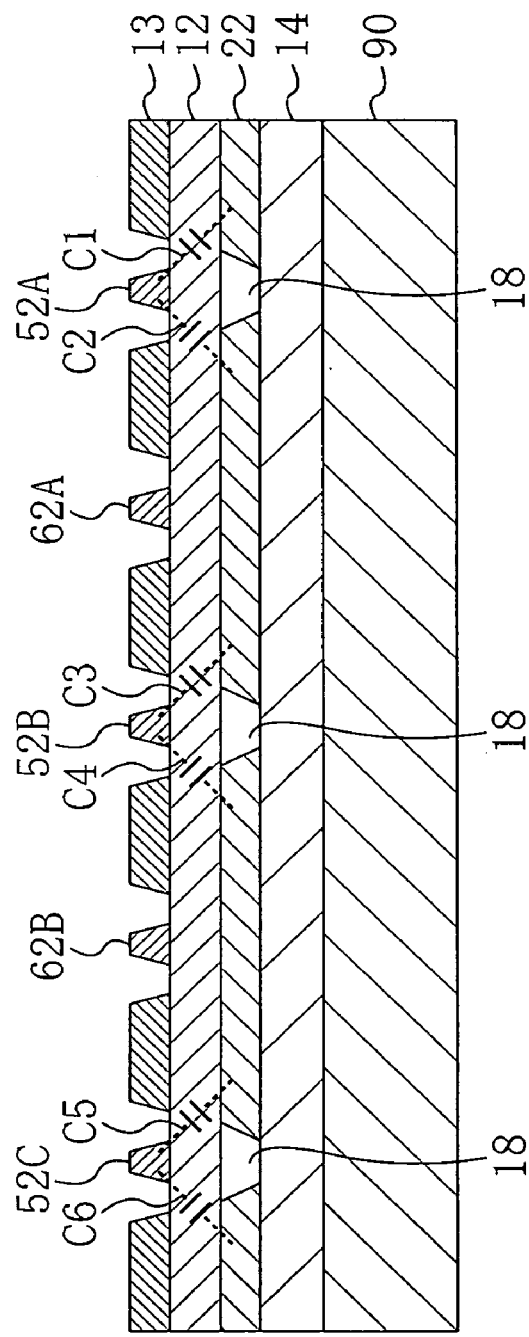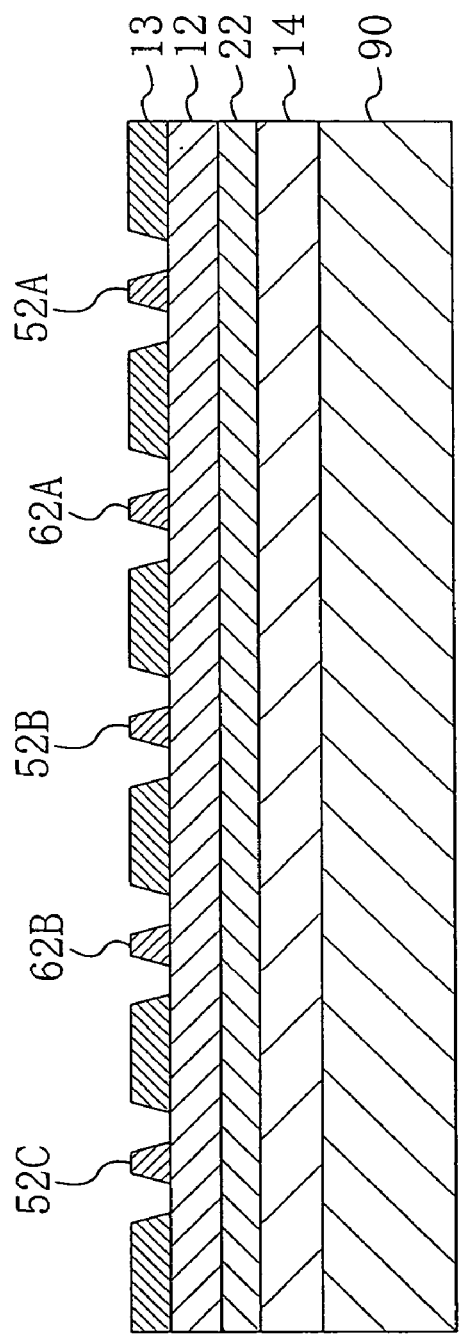
FIG. 14A
FIG. 14B

RF SWITCHING CIRCUIT FOR USE IN MOBILE COMMUNICATION SYSTEMS

CROSS-REFERENCE TO RELATED APPLICATION

The disclosure of Japanese Patent Application No. 2004-161222 filed on May 31, 2004 including specification, drawings and claims is incorporated herein by reference in its entirety.

BACKGROUND OF THE INVENTION

The present invention relates to switching circuits and semiconductor devices for switching signals in, for example, mobile communication equipment.

In recent mobile communication systems typified by cellular phones, expectations for radio-frequency (RF) switches with high performance using field effect transistors (FETs) have been growing. However, the RF switches using FETs have a drawback in which their RF characteristics deteriorate at the input of high power. To eliminate this drawback, a technique of connecting a plurality of FETs in series has been adopted. In addition, to reduce the size and cost of a semiconductor chip, a technique of using a multi-gate FET including a plurality of gate electrodes between a drain electrode and a source electrode is proposed instead of the technique of connecting a plurality of FETs in series.

Now, a conventional method for improving RF characteristics of an RF switching circuit using a multi-gate FET will be described with reference to the drawings (see Japanese Unexamined Patent Publication (Kokai) No. 2000-183362).

FIG. 17 illustrates a layout of a switching circuit constituted by a dual gate FET on a semiconductor substrate according to a conventional example. FIGS. 18A and 18B illustrate cross-sectional structures taken along the lines XVIIIa—XVIIIa and XVIIIb—XVIIIb, respectively, in FIG. 17.

As shown in FIG. 17, two ohmic electrodes 4A and 4B are formed and spaced from each other on an active layer 3 provided on a semiconductor substrate 2. Two gates 5A and 5B as Shottkey electrodes are formed between the ohmic electrodes 4A and 4B. The gates 5A and 5B are connected to respective gate pads 6. An inter-gate region 3A, which is the region between the gates 5A and 5B on the active layer 3, is connected to the ohmic electrode 4A via a connection pattern 7.

Now, it will be described how the switching circuit of the conventional example operates. Suppose a high-level voltage for turning the FET ON is 3 V, which is equal to a power supply voltage, and a low-level voltage for turning the FET OFF is 0 V, which is equal to a ground voltage. Then, when 3V is applied to the ohmic electrodes 4A and 4B and 0 V is applied to the gates 5A and 5B by way of the gate pads 6, depletion layers 8a are formed in parts of the active layer 3 under the respective gates 5A and 5B as shown in FIG. 18A. Accordingly, channel is closed, so that the FET is turned OFF.

In the switching circuit shown in FIG. 17, a direct-current (DC) potential at the inter-gate region 3A between the gates 5A and 5B is substantially equal to a DC potential at the ohmic electrode 4A by the connection pattern 7. Accordingly, the gates 5A and 5B are reverse biased, so that the depletion layers 8a more readily expand than in a case where the connection pattern 7 is not provided. At this time, depletion-layer capacitances C11a through C14a are the same. As a result, isolation to an RF signal between the ohmic electrodes 4A and 4B is enhanced.

However, a voltage applied to the ohmic electrodes during actual operation of the FET is not equal to the power supply voltage and is approximately 90% of the power supply voltage because of the influence of a voltage drop. In addition, the resistance value of the inter-gate region 3A is larger than that of the ohmic electrode 4A by about two orders of magnitude. Accordingly, the gates of the FET in the OFF state are not sufficiently reverse biased at the line XVIIIb—XVIIIb apart from the connection pattern 7, so that insufficient depletion layers 8b are formed as shown in FIG. 18B. This makes the depletion-layer capacitances C11b and C14b smaller than the depletion-layer capacitances C12b and C13b. As a result, the isolation to an RF signal becomes insufficient.

In a case where the depletion layers formed in regions under the gates expand insufficiently, the OFF state of the RF switching circuit is not maintained when a relatively-low signal is input, so that waveform distortion occurs. As a result, there arises a problem in which this waveform distortion increases harmonic distortion.

On the other hand, in a case where a bias voltage is directly applied to the ohmic electrodes and the potentials at the ohmic electrodes are fixed at the power supply voltage, the gates are sufficiently reverse biased in the OFF state where the ground voltage is applied to the gates. In this case, however, in the ON state where the power supply voltage is applied to the gates, the potential difference between each of the gates and the source is 0 V and an insufficient forward bias voltage is generated. Accordingly, there arises another problem of a large insertion loss in this ON state.

SUMMARY OF THE INVENTION

It is therefore an object of the present invention to provide a switching circuit in which deterioration of isolation and increase of harmonic distortion with respect to an RF signal are prevented and the insertion loss in an ON state is small even with the use of a multi-gate FET.

In order to achieve this object, according to the present invention, an RF switching circuit with a multi-gate FET has a configuration in which a bias voltage at a level different from a voltage applied to gates of the multi-gate FET is applied to a region between the gates on a semiconductor layer.

Specifically, a first RF switching circuit according to the present invention is an RF switching circuit including: a plurality of input/output terminals for inputting and outputting an RF signal; and a switch for opening and closing an electrical connection between the input/output terminals. The switch is constituted by a multi-gate field effect transistor including a plurality of gates located between source and drain spaced from each other on a semiconductor layer. A bias voltage is applied to an inter-gate region of the semiconductor layer between the gates. The bias voltage is equal to or lower than 90% of a high-level voltage, which is a voltage for turning the multi-gate field effect transistor ON, in a state where the multi-gate field effect transistor is ON, and is equal to or higher than 80% of the high-level voltage and equal to or lower than the high-level voltage in a state where the multi-gate field effect transistor is OFF.

In the first RF switching circuit, the gates are sufficiently reverse biased, so that sufficient depletion layers are formed in regions of the semiconductor layer under the respective gates. Accordingly, stray capacitances between the gates and the drain and between the gates and the source are sufficiently reduced and made uniform. As a result, an RF switching circuit exhibiting enhanced isolation and low harmonic distortion is achieved. On the other hand, when the transistor is ON, a voltage applied to the inter-gate region of the transistor is equal to or lower than 90% of the high-level voltage, so that a sufficient potential difference between the gates and the inter-gate region is obtained. Accordingly, the gates are forward biased, and the ON resistance is reduced.

In the first RF switching circuit, the number of said input/output terminals is preferably three. The RF switching circuit is preferably an SPDT RF switching circuit including two said multi-gate field effect transistors each connected between each two of the input/output terminals. A control line connected between the gates of one of the multi-gate field effect transistors and the inter-gate regions of the other multi-gate field effect transistor is preferably further provided.

This configuration ensures application of a bias voltage to the inter-gate region.

The first RF switching circuit may further include a diode provided between the control line and the inter-gate region, the diode having a cathode connected to the inter-gate region.

With this configuration, a forward current flowing in the gates is reduced, so that a high-performance RF switching circuit with low power consumption is achieved.

Alternatively, the number of said input/output terminals may be three, the RF switching circuit may be an SPDT RF switching circuit including two said multi-gate field effect transistors each connected between each two of the input/output terminals, and the inter-gate region of one of the multi-gate field effect transistors may be connected to the inter-gate region of the other multi-gate field effect transistor. With this configuration, a high-performance RF switching circuit having a simple configuration is achieved.

A second RF switching circuit according to the present invention is an RF switching circuit including: a plurality of input/output terminals for inputting and outputting an RF signal; and a switch for opening and closing an electrical connection between the input/output terminals. The switch is constituted by a multi-gate field effect transistor including a plurality of gates located between source and drain spaced from each other on a semiconductor layer. The multi-gate field effect transistor has a biasing gate used for applying a bias voltage and provided between the gates.

In the second RF switching circuit, the multi-gate field effect transistor constituting the RF switching circuit includes a biasing gate for applying a bias voltage to a part of the semiconductor layer between the gates. When a bias voltage is applied to the biasing gate, the gates are sufficiently reverse biased. This allows depletion layers to sufficiently expand in regions of the semiconductor layer under the respective gates, so that stray capacitances between the gates and the drain and between the gates and the source are sufficiently reduced and made uniform. As a result, an RF switching circuit exhibiting enhanced isolation and low harmonic distortion is achieved.

In the second RF switching circuit, a voltage equal to or higher than 80% of a high-level voltage for turning the multi-gate field effect transistor ON and equal to or lower than the high-level voltage is preferably applied to the biasing gate. This configuration ensures that the gates are reverse biased when the RF switching circuit is OFF, so that isolation is enhanced.

In this case, a voltage equal to or lower than 90% of the high-level voltage is preferably applied to the biasing gate. With this configuration, isolation is enhanced when the RF switch circuit is OFF and the ON resistance is reduced in the ON state as compared to a case where a high-level voltage is applied.

In the second RF switching circuit, the number of said input/output terminals is preferably three. The RF switching circuit is preferably an SPDT RF switching circuit including two said multi-gate field effect transistors each connected between each two of the input/output terminals. A biasing line connecting the biasing gates of the multi-gate field effect transistors together is preferably further provided. This configuration ensures application of a bias voltage to the biasing gate.

The second RF switching circuit preferably further includes two shunt circuits each for causing one of the input/output terminals connected to one of the multi-gate field effect transistors to be grounded with respect to an RF signal. Each of the shunt circuits is preferably connected between one of the input/output terminals and a ground and constituted by a multi-gate field effect transistor including a biasing gate. The multi-gate field effect transistor constituting each of the shunt circuits is preferably connected to the biasing line. With this configuration, the input/output terminals are grounded with respect to an RF signal, so that isolation of the RF switching circuit is further enhanced.

A voltage equal to the high-level voltage is preferably applied to the biasing line. This configuration ensures that the gates of the multi-gate field effect transistor in an OFF state are reverse biased.

The biasing line may be connected to the input/output terminals connected to the respective multi-gate field effect transistors. This configuration ensures application of a bias voltage without the need of an additional power supply circuit.

The biasing line is preferably provided with a level shift circuit for generating a voltage equal to or higher than 80% and equal to or lower than 90% of the high-level voltage. With this configuration, the gates of the multi-gate field effect transistor are forward biased in an ON state and the gates are reverse biased in an OFF state.

In this case, the level shift circuit preferably includes: two level shift diodes each having an anode connected to one of a pair of control lines for controlling the gates of the multi-gate field effect transistors and a cathode connected to the biasing line; and two bias voltage adjusting resistors each having two terminals, one of the terminals is connected to an associated one of the control lines and the other terminal is connected to the biasing line.

In the first and second RF switching circuits of the present invention, the high-level voltage is preferably a power supply voltage.

A semiconductor device according to the present invention is characterized in that an RF switching circuit according to the present invention is integrated on a semiconductor substrate.

In the semiconductor device of the present invention, an RF switching circuit exhibiting excellent isolation and low harmonic distortion is integrated on a semiconductor substrate, so that a high-performance semiconductor device for an RF signal having a small size is achieved.

In the semiconductor device of the present invention, an RF amplifier for amplifying RF power is preferably further provided. With this configuration, a loss at a connection part is reduced, so that a semiconductor device for an RF signal with low power consumption and a small size is achieved.

In a switching circuit and a semiconductor device according to the present invention, even with the use of a multi-gate field effect transistor, degradation of isolation and increase of harmonic distortion with respect to an RF signal do not occur and, in addition, an RF switching circuit with a small insertion loss in an ON state is achieved.

BRIEF DESCRIPTION OF THE DRAWINGS

FIGS. 3A and 3B illustrate a semiconductor substrate on which the RF switching circuit of the first embodiment is integrated. FIG. 3A is a cross-sectional view taken along the line IIIa—IIIa in FIG. 2. FIG. 3B is a cross-sectional view taken along the line IIIb—IIIb in FIG. 2.

FIGS. 10A and 10B illustrate a cross-section taken along the line X—X in FIG. 9. FIG. 10A is a cross-sectional view illustrating an OFF state of a transistor. FIG. 10B is a cross-sectional view illustrating an ON state of the transistor.

FIGS. 14A and 14B illustrate a cross-section taken along the line XIV—XIV in FIG. 13. FIG. 14A is a cross-sectional view illustrating an OFF state of a transistor. FIG. 14B is a cross-sectional view illustrating an ON state of the transistor.

FIG. 18A is a cross-sectional view taken along the line XVIIIa—XVIIIa in FIG. 17. FIG. 18B is a cross-sectional view taken along the line XVIIIb—XVIIIb in FIG. 17.

DESCRIPTION OF THE PREFERRED EMBODIMENTS

Embodiment 1

Figure 1:
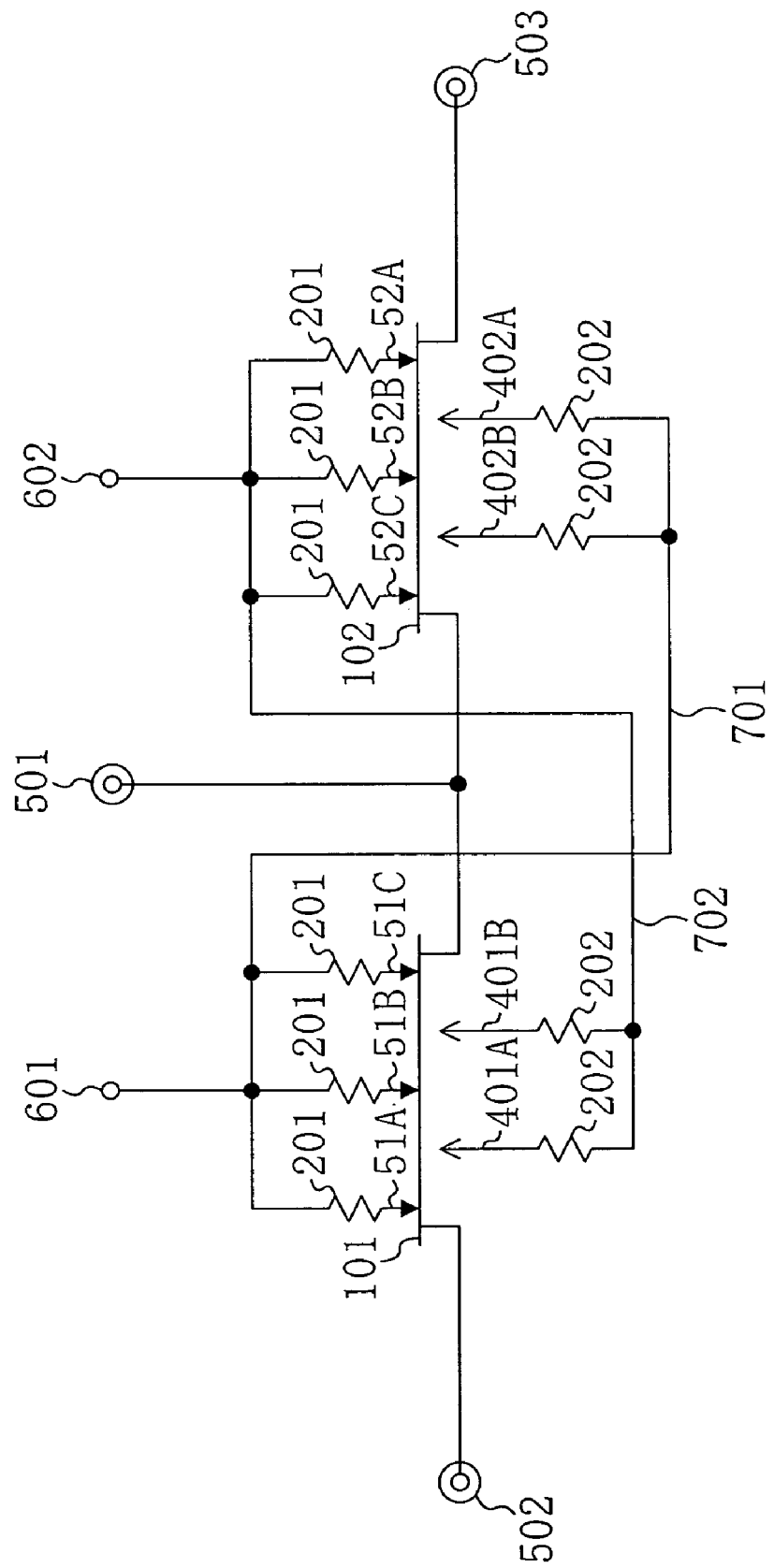
FIG. 1 is a circuit diagram illustrating an RF switching circuit according to a first embodiment of the present invention.

A first embodiment of the present invention will be described with reference to the drawings. FIG. 1 illustrates an equivalent circuit of an RF switching circuit according to the first embodiment. As shown in FIG. 1, a first FET 101, which is a multi-gate field effect transistor (FET) having three gates, is connected between a first input/output terminal 501 and a second input/output terminal 502. A second FET 102, which is also a multi-gate FET having three gates, is connected between the first input/output terminal 501 and a third input/output terminal 503. In this manner, a single pole double throw (SPDT) RF switching circuit is configured.

The first FET 101 has a first gate 51A, a second gate 51B and a third gate 51C that are connected to a first control line 701 via respective resistors 201. The second FET 102 has a first gate 52A, a second gate 52B and a third gate 52C that are connected to a second control line 702 via respective resistors 201.

On the other hand, the first FET 101 includes an inter-gate region 401A and an inter-gate region 401B that are connected to the second control line 702 via respective resistors 202. The second FET 102 includes an inter-gate region 402A and an inter-gate region 402B that are connected to the first control line 701 via respective resistors 202. The first control line 701 and the second control line 702 are connected to a first control terminal 601 and a second control terminal 602, respectively.

Figure 2:
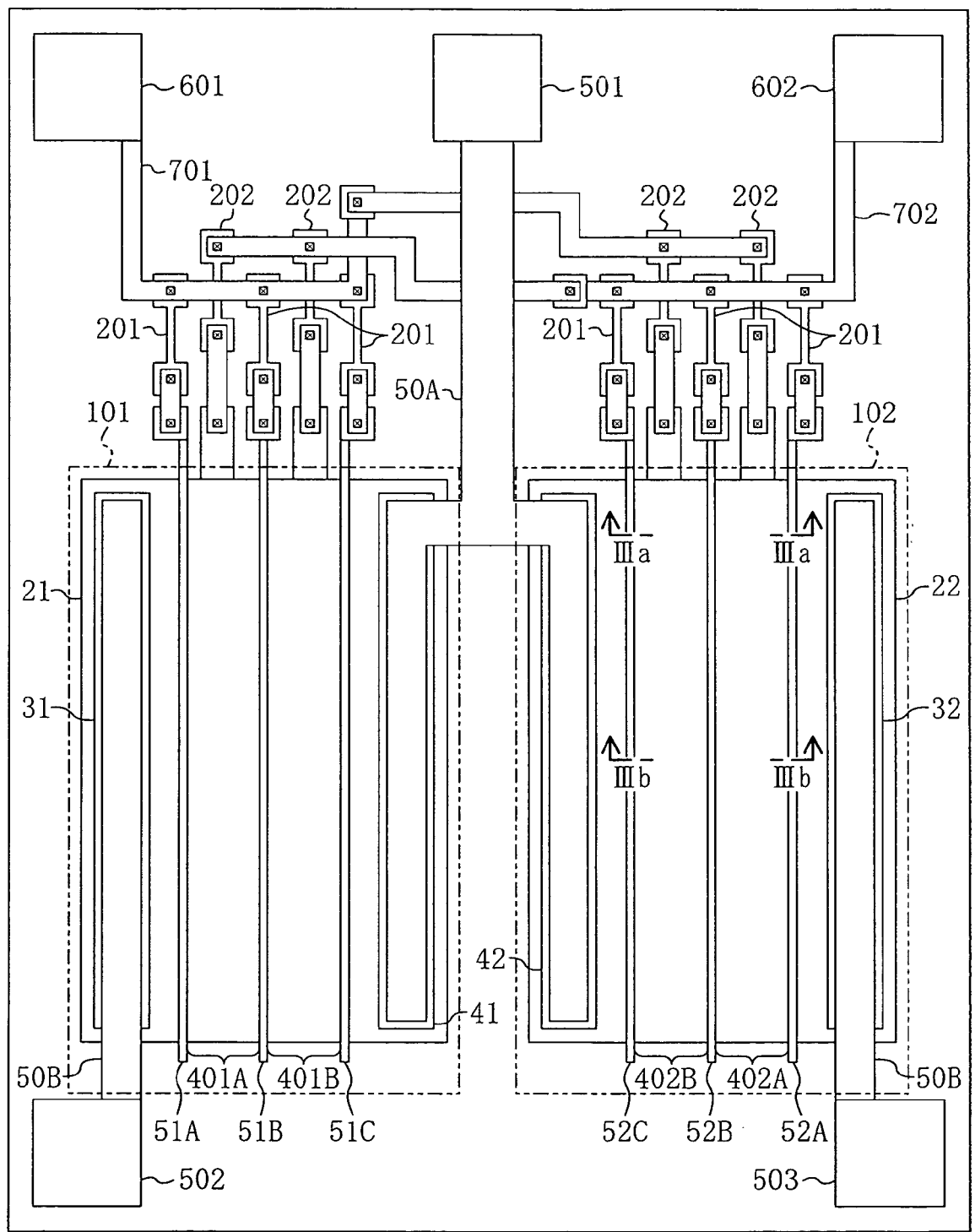
FIG. 2 is a plan view illustrating a semiconductor substrate on which the RF switching circuit of the first embodiment is integrated.

Now, a semiconductor device according to this embodiment in which the RF switching circuit is integrated will be described. FIG. 2 is a plan view illustrating a configuration of a semiconductor substrate on which the RF switching circuit of this embodiment is integrated.

As shown in FIG. 2, the first input/output terminal 501, the second input/output terminal 502 and the third input/output terminal 503 are formed on a semiconductor substrate 90. A first active layer 21 that is a rectangular in the plan view is formed in part of the semiconductor substrate 90 between the first input/output terminal 501 and the second input/output terminal 502. A second active layer 22 that is a rectangular in the plan view is formed in part of the semiconductor substrate 90 between the first input/output terminal 501 and the third input/output terminal 503.

The first through third gates 51A through 51C are formed at regular intervals on a middle portion of the first active layer 21 along the length direction. A source 31 and a drain 41 are respectively formed at both sides of the first active layer 21 along the length direction. In this manner, the first FET 101 is formed. In the same manner, the second FET 102 is formed on the second active layer 22.

The first FET 101 has the drain 41 connected to the first input/output terminal 501 via a metal interconnect 50A and the source 31 connected to the second input/output terminal 502 via a metal interconnect 50B. On the other hand, the second FET 102 has a drain 42 connected to the first input/output terminal 501 via the metal interconnect 50A and a source 32 connected to the third input/output terminal 503 via the metal interconnect 50B.

The first through third gates 51A through 51C are connected to the first control line 701, which is a metal interconnect, via the respective resistors 201. The inter-gate region 402A and the inter-gate region 402B of the second FET 102 are connected to the first control line 701 via the respective resistors 202. The first control line 701 is connected to the first control terminal 601.

In the same manner, the first through third gates 52A through 52C of the second FET 102 and the inter-gate regions 401A and 401B of the first FET 101 are connected to the second control line 702, which is connected to the second control terminal 602.

FIGS. 3A and 3B illustrate cross-sectional structures taken along the lines IIIa—IIIa and IIIb—IIIb, respectively, in FIG. 2. As shown in FIGS. 3A and 3B, the second FET 102 has a structure in which a buffer layer 14, the active layer 22 and a non-doped layer 12 are stacked in this order on the semiconductor substrate 90 and a cap layer 13 is formed on the non-doped layer 12. The cap layer 13 has equally-spaced openings in each of which the non-doped layer 12 is exposed. The first through third gates 52A through 52C as Shottkey electrodes are formed in the respective openings.

Now, it will be described how the RF switching circuit of this embodiment operates in a case where an RF signal input to the second input/output terminal 502 is output from the first input/output terminal 501. In this embodiment, it is assumed that a high-level voltage applied to the gates to turn the first and second FETs 101 and 102 ON is 3 V, which is equal to a power supply voltage, and a low-level voltage applied to the gates to turn these FETs OFF is 0 V, which is equal to a ground voltage.

In the case where a signal input to the second input/output terminal 502 is output from the first input/output terminal 501, 3 V is applied to the first control terminal 601 and 0 V is applied to the second control terminal 602. In this manner, 3 V is applied to the first through third gates 51A through 51C of the first FET 101, so that the first FET 101 is turned ON. On the other hand, 0 V is applied to the first through third gates 52A through 52C of the second FET 102, so that the second FET 102 is turned OFF.

Since 0 V is also applied to the inter-gate regions 401A and 401B of the first FET 101 in the ON state, the first through third gates 51A through 51C of the first FET 101 are sufficiently forward biased, so that the ON resistance decreases and the insertion loss is reduced.

On the other hand, since 3 V is also applied to the inter-gate regions 402A and 402B of the second FET 102 in the OFF state, the first through third gates 52A through 52C of the second FET 102 are sufficiently reverse biased. Accordingly, as shown in FIGS. 3A and 3B, depletion layers 18a are sufficiently formed in the entire regions under the respective first through third gates 52A through 52C of the second FET 102 in the active layer 22. This substantially equalizes the depletion-layer capacitances C1a through C6a and C1b through C6b, so that an RF voltage applied to the second FET 102 in the OFF state is equally divided by the depletion-layer capacitances. As a result, isolation between the first input/output terminal 501 and the third input/output terminal 503 is enhanced and harmonic distortion is reduced.

Figure 4:
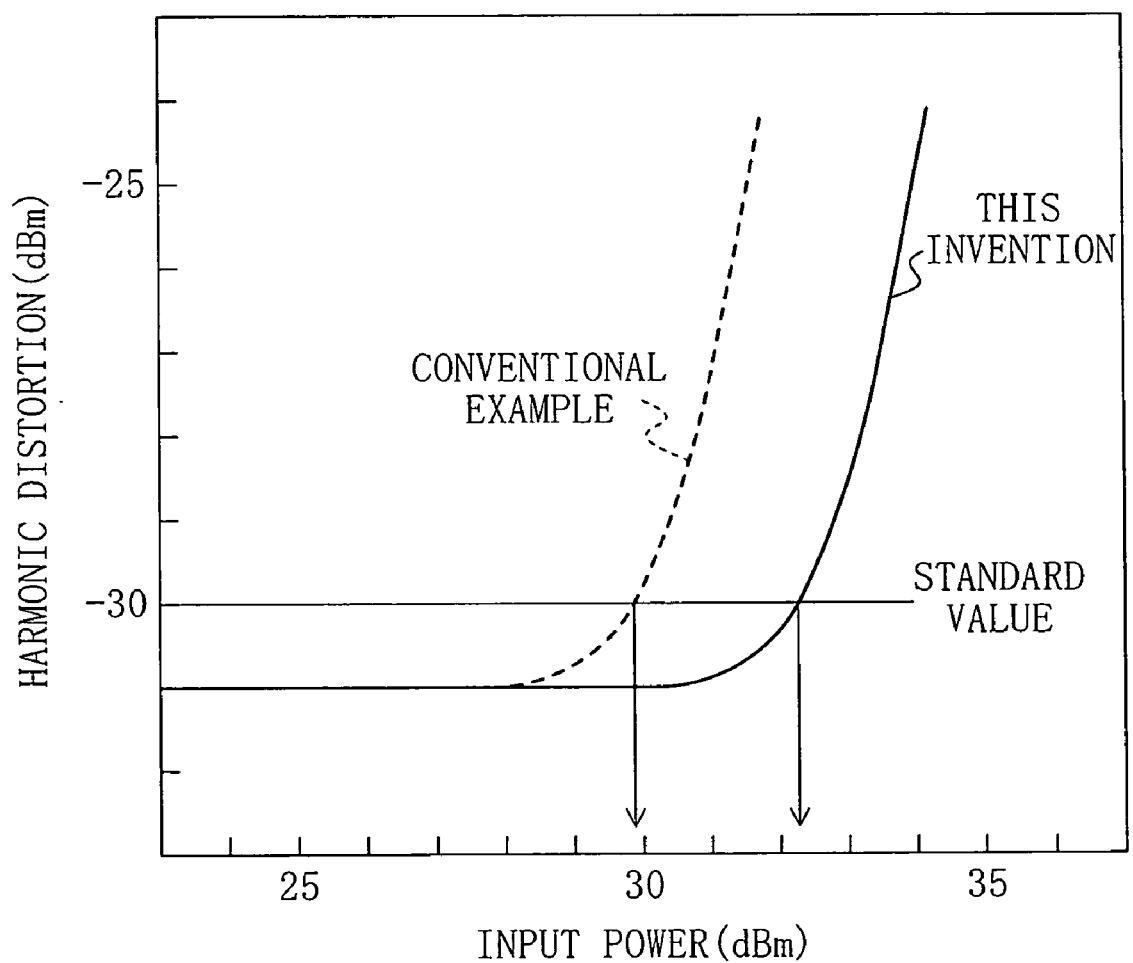
FIG. 4 is a graph showing a correlation between input power and harmonic distortion of the RF switching circuit of the first embodiment.

FIG. 4 is a graph showing a relationship between input power and harmonic distortion. In FIG. 4, the abscissa indicates the input power value (dBm) and the ordinate indicates the harmonic distortion (dBm). As shown in FIG. 4, in the case of the RF switching circuit of this embodiment indicated by the solid curve, the input power value corresponding to a general standard value of harmonic distortion of −30 dBm is improved by about 2 dBm, as compared to an RF switching circuit according to a conventional example indicated by the dashed curve.

Figure 5:
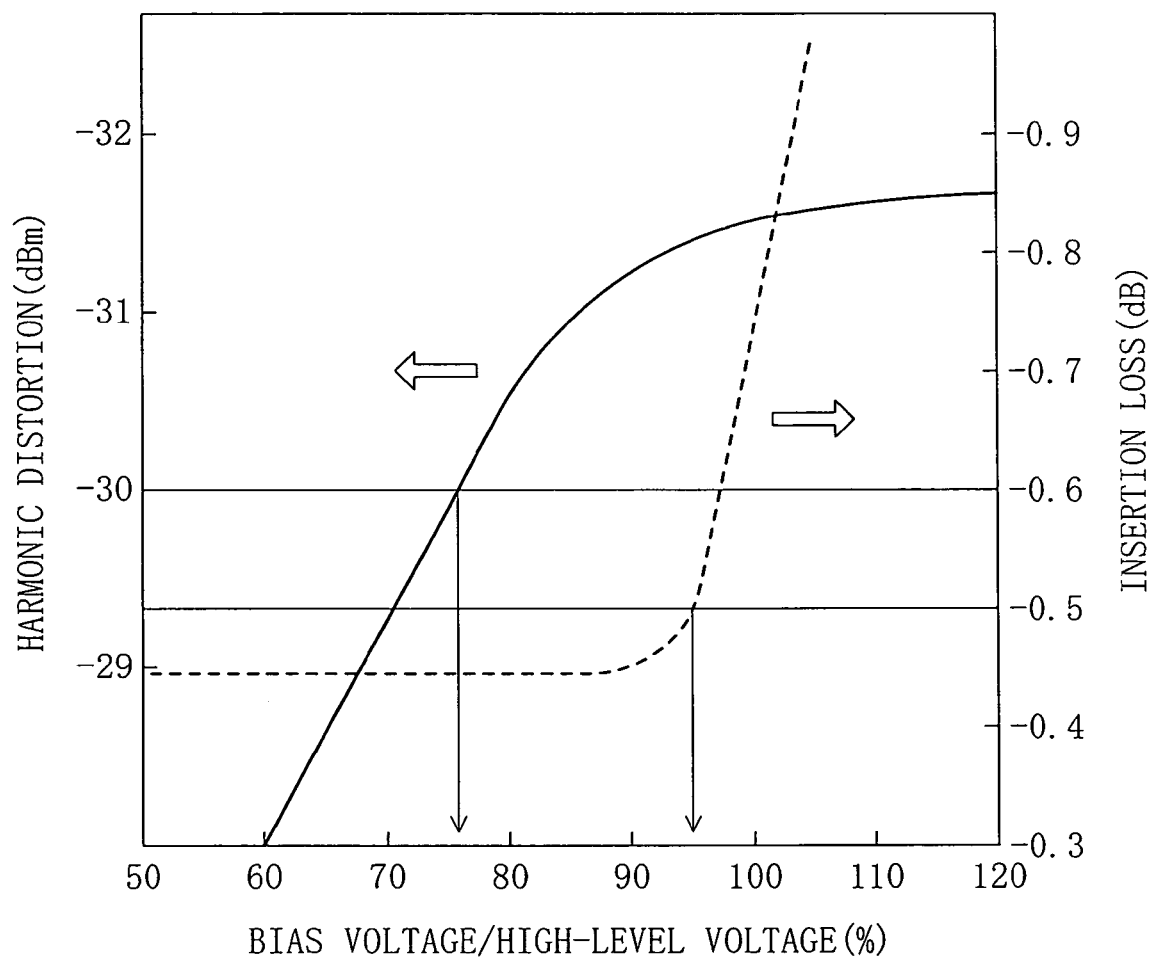
FIG. 5 is a graph showing variations of harmonic distortion and insertion loss with a varying voltage applied to inter-gate regions of the RF switching circuit of the first embodiment.

FIG. 5 shows a variation of the harmonic distortion and a variation of the insertion loss with a varying bias voltage applied to inter-gate regions. In FIG. 5, the abscissa indicates the ratio (%) of a bias voltage applied to the inter-gate regions of the FET in an OFF state with respect to a high-level voltage applied to the gates in an ON state. The left-side ordinate indicates the harmonic distortion (dBm) and the right-side ordinate indicates the insertion loss (dB). In FIG. 5, the harmonic distortion indicated by the solid curve increases as the bias voltage decreases, and does not satisfy −30 dBm, which is a general standard value, when the bias voltage is less than 80% of the high-level voltage. This is because the bias voltage is too low to apply a sufficient reverse bias, so that depletion layers do not expand sufficiently.

On the other hand, the insertion loss indicated by the dashed curve rapidly increases and exceeds −0.5 dB, which is a general standard value, when the bias voltage exceeds 90% of the high-level voltage. This is because the bias voltage is too high to apply a sufficient forward bias.

Accordingly, to enhance isolation by applying a sufficient reverse bias to the gates of the FET in an OFF state and to reduce the insertion loss by applying a forward bias to the gates of the FET in an ON state, it is preferable to apply a voltage equal to or higher than 80% of the high-level voltage when the FET is OFF and apply a voltage equal to or lower than 90% of the high-level voltage when the FET is ON.

In the RF switching circuit of this embodiment, the high-level voltage is applied to inter-gate regions when the FET is OFF whereas the low-level voltage is applied to the inter-gate regions when the FET is ON. Accordingly, a sufficient reverse bias is uniformly applied to the gates of the FET in the OFF state, so that the isolation is enhanced and the harmonic distortion is reduced. In addition, since a forward bias is applied to the gates of the FET in the ON state, the insertion loss is reduced and the harmonic distortion in the case of receiving a high power signal as the whole RF switching circuit is reduced.

MODIFIED EXAMPLE 1 OF EMBODIMENT 1

Figure 6:
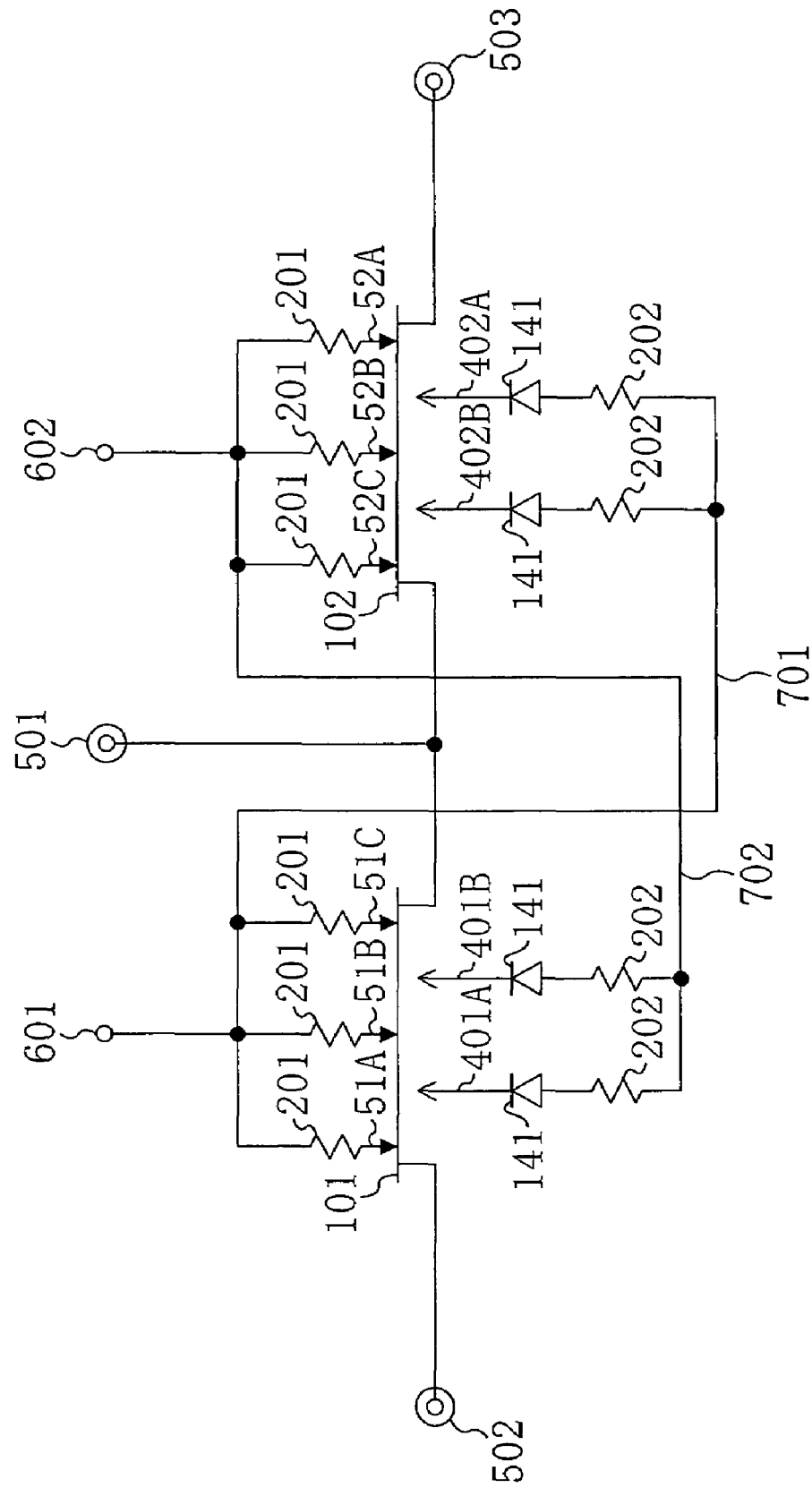
FIG. 6 is a circuit diagram illustrating an RF switching circuit according to a first modified example of the first embodiment.

Hereinafter, a first modified example of the first embodiment will be described with reference to the drawings. FIG. 6 illustrates an equivalent circuit of an RF switching circuit according to this modified example. In FIG. 6, components already shown in FIG. 1 are denoted by the same reference numerals, and thus descriptions thereof will be omitted.

As shown in FIG. 6, in the RF switching circuit of this modified example, inter-gate regions 401A and 401B of a first FET 101 are connected to the cathodes of respective diodes 141 whose anodes are connected to a second control line 702 via respective resistors 202. In the same manner, inter-gate regions 402A and 402B of a second FET 102 are connected to the cathodes of respective diodes 141 whose anodes are connected to a first control line 701 via respective resistors 202.

In this modified example, when 0 V is applied to a second control terminal 602, for example, a forward current flowing from a first gate 51A to a third gate 51C of the first FET 101 is reduced because the cathodes of the diodes 141 are connected to the inter-gate regions 401A and 401B.

Accordingly, in addition to the reduction of the harmonic distortion and enhancement of the isolation, power consumption is reduced in this modified example.

MODIFIED EXAMPLE 2 OF EMBODIMENT 1

Figure 7:
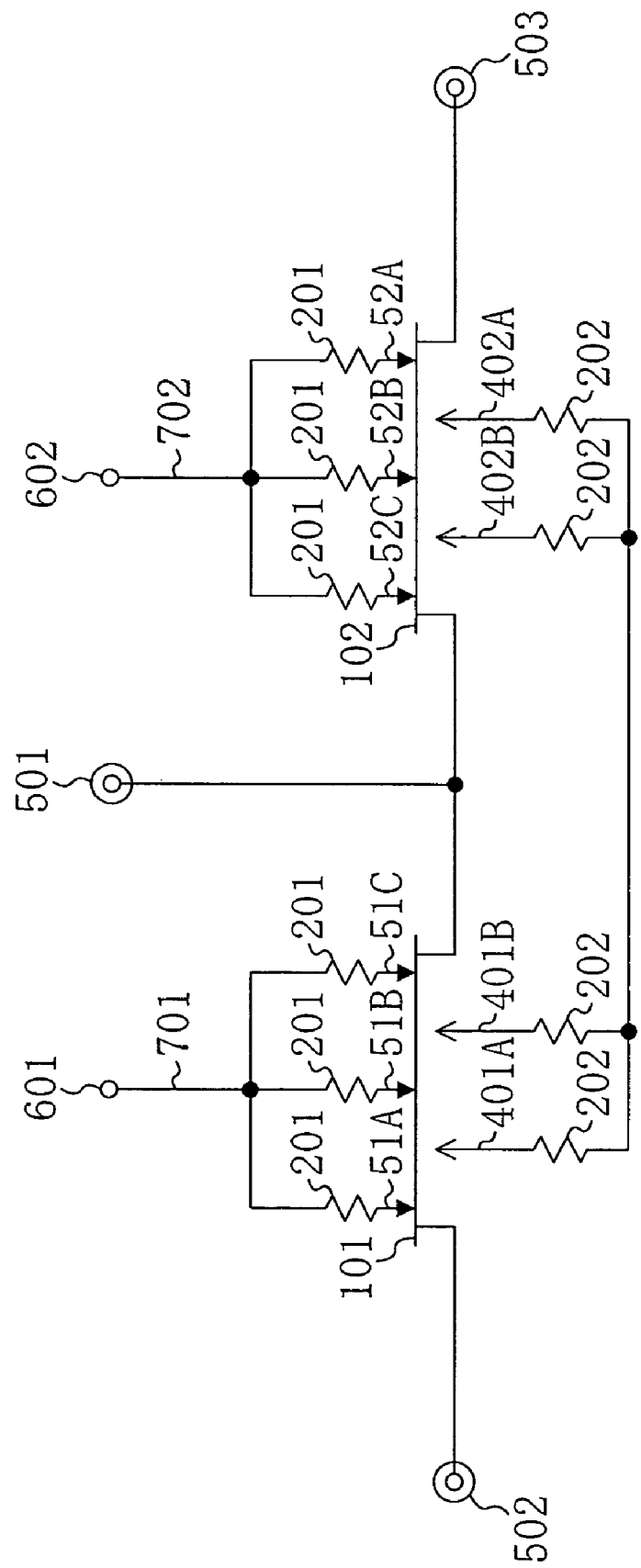
FIG. 7 is a circuit diagram illustrating an RF switching circuit according to a second modified example of the first embodiment.

Hereinafter, a second modified example of the first embodiment will be described with reference to FIG. 7. FIG. 7 illustrates an equivalent circuit of an RF switching circuit according to this modified example. In FIG. 7, components already shown in FIG. 1 are denoted by the same reference numerals, and thus descriptions thereof will be omitted.

As shown in FIG. 7, in the RF switching circuit of this modified example, inter-gate regions 401A and 401B of a first FET 101 are connected to inter-gate regions 402A and 402B of a second FET 102 via resistors 202.

In the RF switching circuit of this modified example, in a case where an RF signal input to a second input/output terminal 502 is output from a first input/output terminal 501, for example, when the first FET 101 is turned ON and the second FET 102 is turned OFF, the potentials at the inter-gate regions 401A and 401B of the first FET 101 are increased by the applied RF signal. Accordingly, the potentials at the inter-gate regions 402A and 402B of the second FET 102 connected to the inter-gate regions 401A and 401B of the first FET 101 via the resistors 202 are also increased. As a result, first through third gates 52A through 52C of the second FET 102 are reverse biased, so that the harmonic distortion is reduced and the isolation is enhanced. In addition, the circuit configuration is simplified, thus enabling reduction of the chip size.

Embodiment 2

Figure 8:
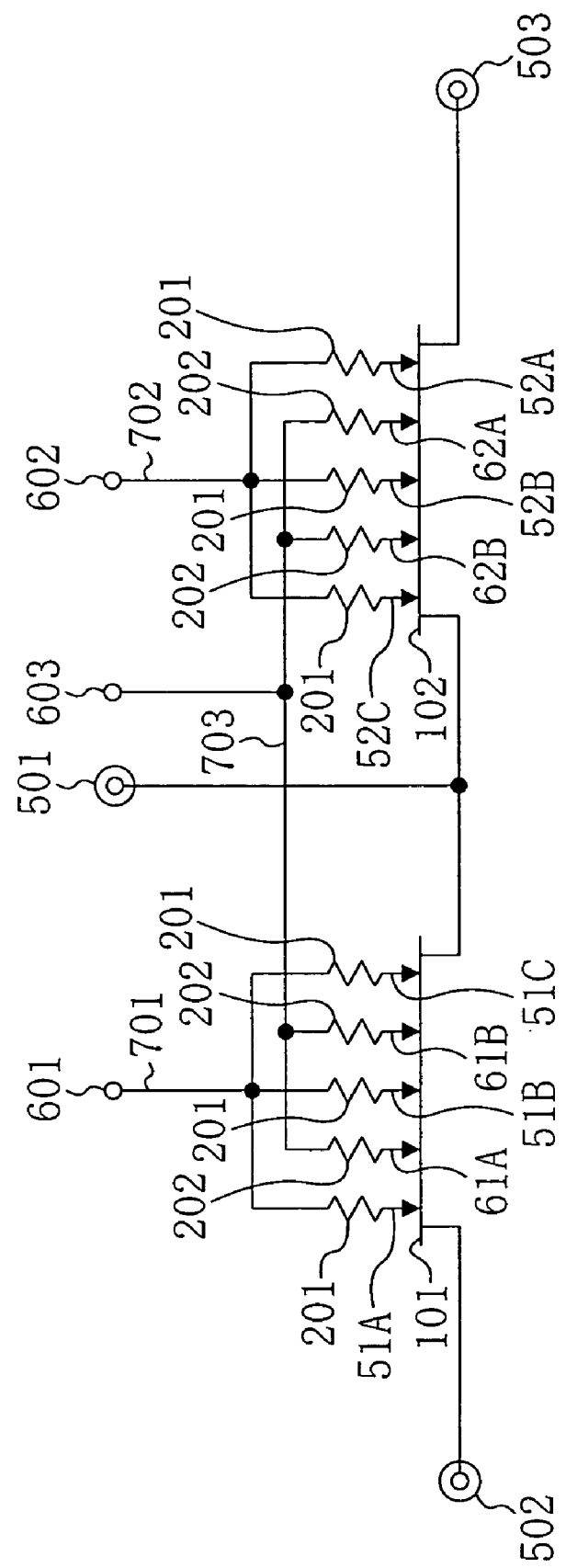
FIG. 8 is a circuit diagram illustrating an RF switching circuit according to a second embodiment of the present invention.

A second embodiment of the present invention will be described with reference to the drawings. FIG. 8 illustrates an equivalent circuit of an RF switching circuit according to the second embodiment. As shown in FIG. 8, a first FET 101 having three gates and two biasing gates is connected between a first input/output terminal 501 and a second input/output terminal 502. A second FET 102 also having three gates and two biasing gates is connected between the first input/output terminal 501 and a third input/output terminal 503. In this manner, an SPDT RF switching circuit is configured.

The first FET 101 has a first gate 51A, a second gate 51B and a third gate 51C that are connected to a first control line 701 via respective resistors 201. The first control line 701 is connected to a first control terminal 601. In the same manner, the second FET 102 has a first gate 52A, a second gate 52B and a third gate 52C that are connected to a second control line 702 via respective resistors 201. The second control line 702 is connected to a second control terminal 602.

On the other hand, a first biasing gate 61A and a second biasing gate 61B of the first FET 101 and a first biasing gate 62A and a second biasing gate 62B of the second FET 102 are connected to a biasing line 703 via respective resistors 202. The biasing line 703 is connected to a biasing terminal 603.

Figure 9:
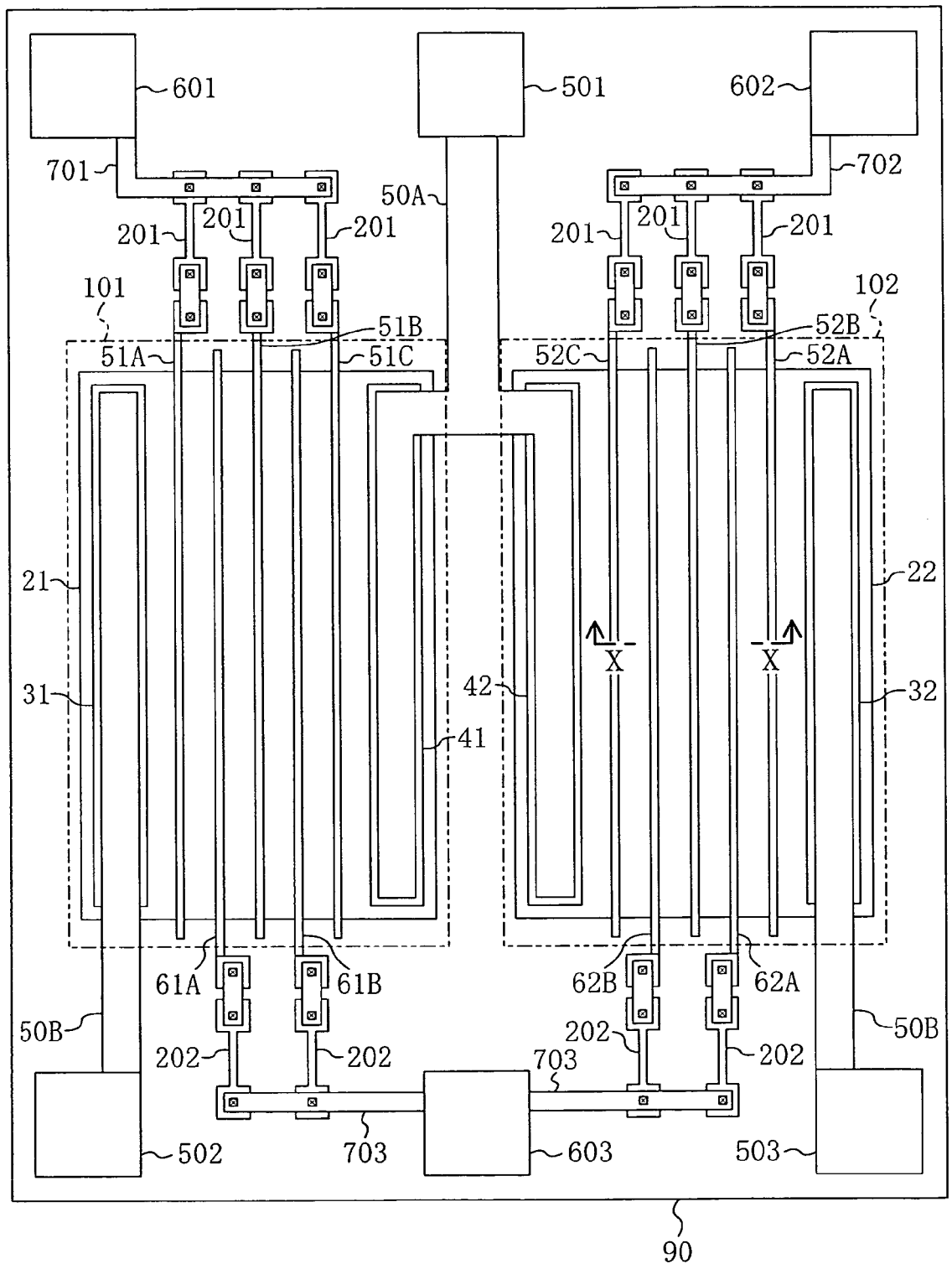
FIG. 9 is a plan view illustrating a semiconductor substrate on which the RF switching circuit of the second embodiment is integrated.

Now, a semiconductor device according to this embodiment in which the RF switching circuit is integrated will be described. FIG. 9 is a plan view illustrating a configuration of a semiconductor substrate on which the RF switching circuit of this embodiment is integrated.

As shown in FIG. 9, the first through third input/output terminals 501 through 503 and the first and second control terminals 601 and 602 and the biasing terminal 603 are formed on a semiconductor substrate 90. A first active layer 21 that is a rectangular in the plan view is formed in part of the semiconductor substrate 90 between the first input/output terminal 501 and the second input/output terminal 502. A second active layer 22 that is a rectangular in the plan view is formed in part of the semiconductor substrate 90 between the first input/output terminal 501 and the third input/output terminal 503.

The first through third gates 51A through 51C are formed at regular intervals on a middle portion of the first active layer 21 along the length direction. A source 31 and a drain 41 are respectively formed at both sides of the first active layer 21 along the length direction. The first biasing gate 61A and the second biasing gate 61B are formed between the first and second gates 51A and 51B and between the second and third gates 51B and 51C, respectively. In this manner, the first FET 101 is configured. In the same manner, the second FET 102 is formed on the second active layer 22.

The first FET 101 has the drain 41 connected to the first input/output terminal 501 via a metal interconnect 50A and the source 31 connected to the second input/output terminal 502 via a metal interconnect 50B. On the other hand, the second FET 102 has a drain 42 connected to the first input/output terminal 501 via the metal interconnect 50A and a source 32 connected to the third input/output terminal 503 via the metal interconnect 50B.

The first through third gates 51A through 51C are connected to the first control line 701, which is a metal interconnect, via the respective resistors 201. The first control line 701 is connected to the first control terminal 601.

In the same manner, the first through third gates 52A through 52C of the second FET 102 are connected to the second control line 702 via the resistors 201, and the second control line 702 is connected to the second control terminal 602.

The first biasing gate 61A and the second biasing gate 61B of the first FET 101 and the first biasing gate 62A and the second biasing gate 62B of the second FET 102 are connected to the biasing line 703 via the resistors 202. The biasing line 703 is connected to the biasing terminal 603.

Now, it will be described how the RF switching circuit of this embodiment operates. FIGS. 10A and 10B respectively show the states of a cross-section taken along the line X—X in FIG. 9. FIGS. 10A and 10B show cases where the second FET 102 is OFF and ON, respectively. In this embodiment, it is assumed that a high-level voltage applied to the gates to turn the first and second FETs 101 and 102 ON is 3 V, which is equal to a power supply voltage, and a low-level voltage applied to the gates to turn these FETs OFF is 0 V, which is equal to a ground voltage.

In a case where a signal input to the second input/output terminal 502 is output from the first input/output terminal 501, 3 V is applied to the first control terminal 601 and 0 V is applied to the second control terminal 602. In this manner, 3 V is applied to the first through third gates 51A through 51C of the first FET 101, so that the first FET 101 is turned ON. On the other hand, 0 V is applied to the first through third gates 52A through 52C of the second FET 102, so that the second FET 102 is turned OFF.

In this case, when 3 V is also applied to the biasing terminal 603, a forward bias voltage is applied to the first and second biasing gates 62A and 62B of the second FET 102 in the OFF state and a forward current flows. This makes the first through third gates 52A through 52C of the second FET 102 reverse biased, so that sufficient depletion layers 18 are formed in parts of the second active layer 22 under the respective first through third gates 52A through 52C as shown in FIG. 10A. Accordingly, depletion-layer capacitances C1 through C6 are equalized, so that an RF voltage applied to the second FET 102 is equally divided among the gates. As a result, high isolation and low distortion are maintained even when the input power is higher than that in a conventional multi-gate FET.

On the other hand, when 0 V is applied to the first control terminal 601 and 3 V is applied to the second control terminal 602 to turn the second FET 102 ON, 3 V is applied to all the first through third gates 52A through 52C and the first and second biasing gates 62A and 62B, so that a normal ON state is implemented as shown in FIG. 10B.

In this embodiment, 3 V, which is the high-level voltage, is applied to the biasing terminal 603. Alternatively, a voltage equal to or higher than 80% of the high-level voltage may be applied. In this case, the gates are also reverse biased, and the same advantages are obtained.

MODIFIED EXAMPLE 1 OF EMBODIMENT 2

Figure 11:
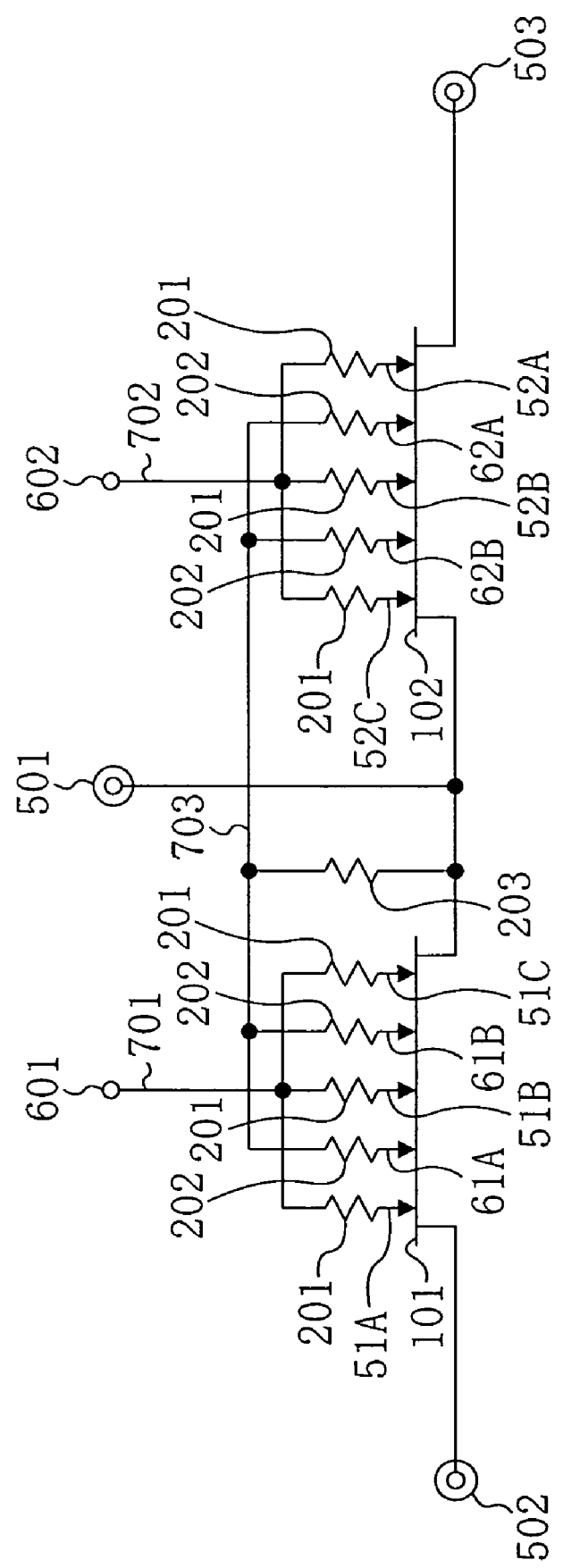
FIG. 11 is a circuit diagram illustrating an RF switching circuit according to a first modified example of the second embodiment.

Hereinafter, a first modified example of the second embodiment will be described with reference to the drawings. FIG. 11 illustrates an equivalent circuit of an RF switching circuit according to this modified example. In FIG. 11, components already shown in FIG. 8 are denoted by the same reference numerals, and thus descriptions thereof will be omitted.

In this modified example, a biasing line 703 is connected to a first input/output terminal 501 via a resistor 203 as shown in FIG. 11.

In the SPDT RF switching circuit including a first FET 101 and a second FET 102 connected to each other, a DC voltage at the input/output terminal 501 as a node at which the first FET 101 and the second FET 102 are connected together is approximately equal to the higher one of voltages applied to a first control terminal 601 and a second control terminal 602. During operation of the RF switching circuit, one of the first FET 101 and the second FET 102 is always ON. Accordingly, 3 V is always applied to one of the first control terminal 601 and the second control terminal 602, so that a DC voltage at the first input/output terminal 501 is always approximately equal to 3 V.

Accordingly, a voltage approximately equal to 3 V, which is the high-level voltage, is always applied to a first biasing gate 61A and a second biasing gate 61B of the first FET 101 and a first biasing gate 62A and a second biasing gate 62B of the second FET 102 connected to the first input/output terminal 501.

In this manner, a forward bias voltage is applied to the first and second biasing gates 62A and 62B of the second FET 102 in the OFF state, and a forward current flows. Accordingly, first through third gates 52A through 52C of the second FET 102 are reverse biased, so that sufficient depletion layers 18 are formed in parts of the second active layer 22 under the respective first through third gates 52A through 52C. This equalizes all depletion-layer capacitances C1 through C6, and an RF voltage applied to the second FET 102 is equally divided among the gates. As a result, high isolation and low distortion are maintained even when the input power is higher than that in a conventional multi-gate FET.

On the other hand, since 3 V is applied to first through third gates 51A through 51C and the first and second biasing gates 61A and 61B of the first FET 101 in the ON state, a normal ON state is implemented.

With this configuration, a power supply for biasing does not need to be provided outside the circuit, so that it is possible to reduce the size of the device.

MODIFIED EXAMPLE 2 OF EMBODIMENT 2

Figure 12:
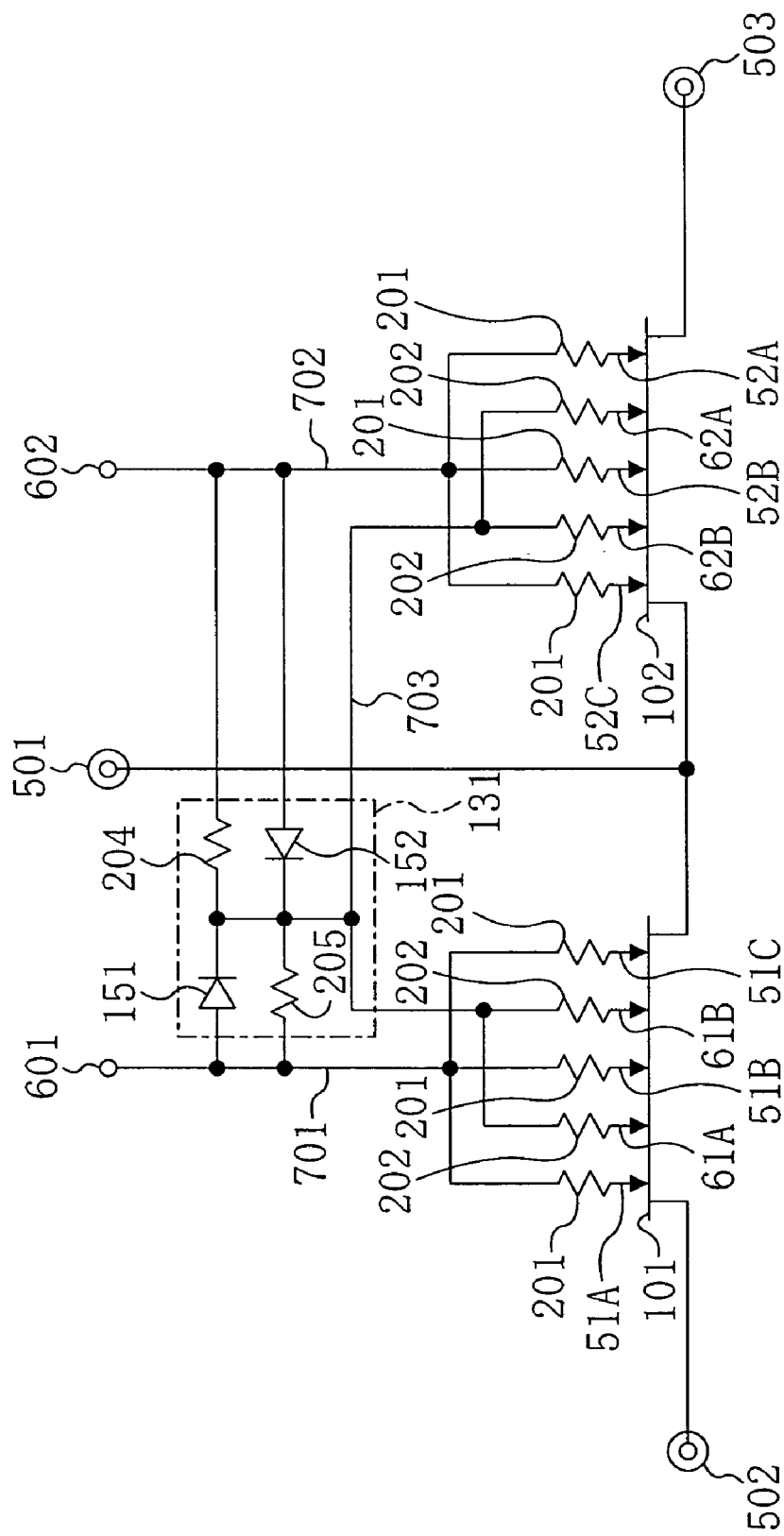
FIG. 12 is a circuit diagram illustrating an RF switching circuit according to a second modified example of the second embodiment.

Hereinafter, a second modified example of the second embodiment will be described with reference to the drawings. FIG. 12 illustrates an equivalent circuit of an RF switching circuit according to this modified example. In FIG. 12, components already shown in FIG. 8 are denoted by the same reference numerals, and thus descriptions thereof will be omitted.

As shown in FIG. 12, in this modified example, a level shift circuit 131 is connected to a biasing line 703. The level shift circuit 131 includes: level shift diodes 151 and 152; and bias voltage adjusting resistors 204 and 205. The cathodes of the level shift diodes 151 and 152 and one of the terminals of each of the bias voltage adjusting resistors 204 and 205 are connected to the biasing line 703. The anode of the level shift diode 151 and the other terminal of the bias voltage adjusting resistor 205 are connected to a first control line 701. The anode of the level shift diode 152 and the other terminal of the bias voltage adjusting resistor 204 are connected to a second control line 702.

Figure 13:
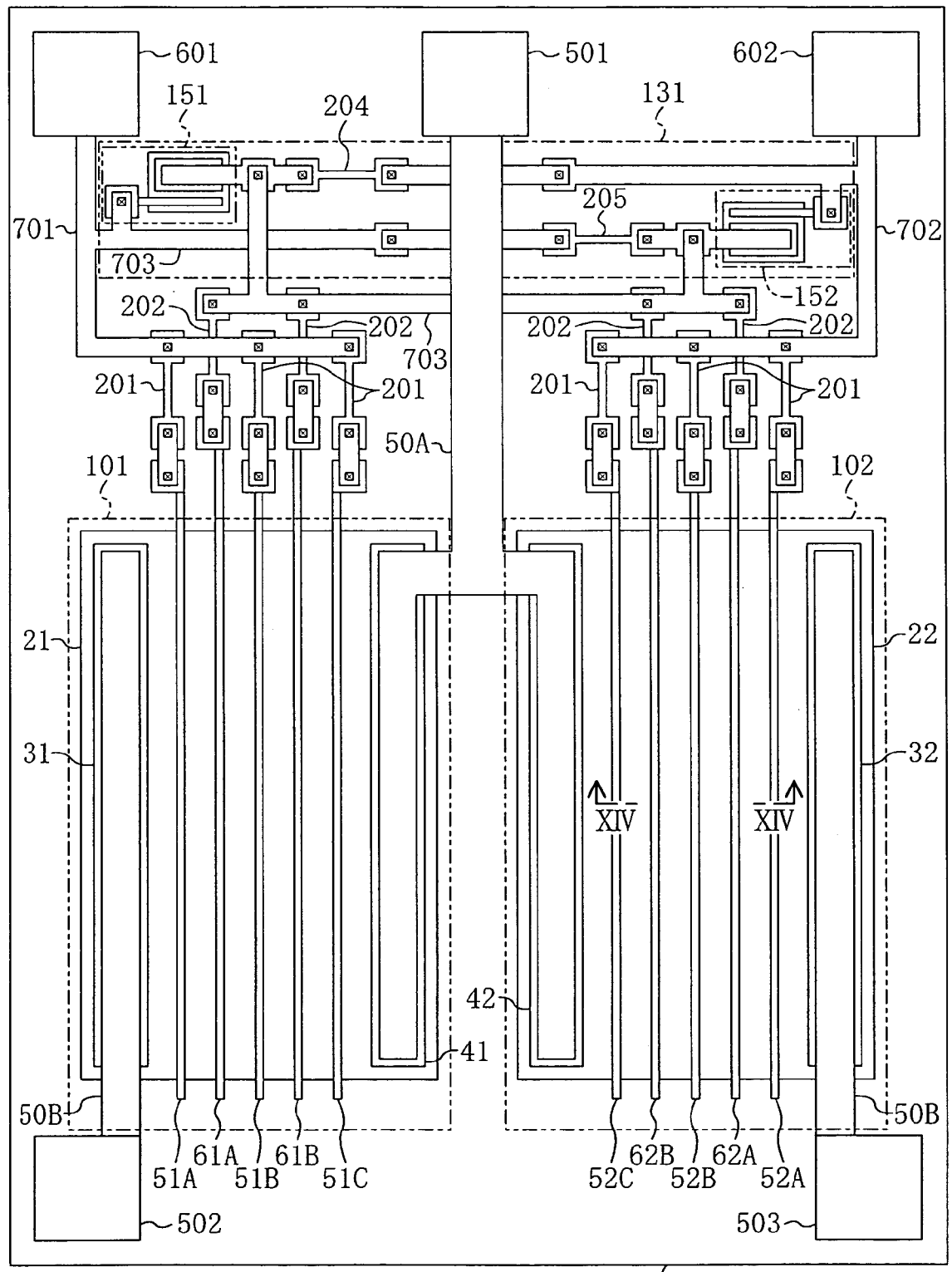
FIG. 13 is a plan view illustrating a semiconductor substrate on which the RF switching circuit of the second modified example of the second embodiment is integrated.

Now, a semiconductor device according to this modified example in which the RF switching circuit is integrated will be described. FIG. 13 is a plan view illustrating a configuration of a semiconductor substrate on which the RF switching circuit of this modified example is integrated. In FIG. 13, components already shown in FIG. 9 are denoted by the same reference numerals, and descriptions thereof will be omitted.

As shown in FIG. 13, the level shift circuit 131 is formed in a region adjacent to the biasing line 703 on the surface of a semiconductor substrate 90. The level shift circuit 131 includes the level shift diodes 151 and 152. The cathode of the level shift diode 151 is connected to the biasing line 703 and is also connected to the second control line 702 via the bias voltage adjusting resistor 204. The anode of the level shift diode 151 is connected to the first control line 701. On the other hand, the cathode of the level shift diode 152 is connected to the biasing line 703 and is also connected to the first control line 701 via the bias voltage adjusting resistor 205. The anode of the level shift diode 152 is connected to the second control line 702.

Now, it will be described how the RF switching circuit of this modified example operates in a case where an RF signal input to a second input/output terminal 502 is output from a first input/output terminal 501. FIGS. 14A and 14B respectively show the states of a cross-section taken along the line XIV—XIV in FIG. 13. FIGS. 14A and 14B show cases where the second FET 102 is OFF and ON, respectively.

In this modified example, it is assumed that a high-level voltage applied to the gates to turn the first and second FETs 101 and 102 ON is 3 V, which is equal to a power supply voltage, and a low-level voltage applied to the gates to turn these FETs OFF is 0 V, which is equal to a ground voltage. The forward turn-on voltages of the level shift diodes 151 and 152 are 0.5 V.

On this assumption, when 3 V is applied to a first control terminal 601 and 0 V is applied to a second control terminal 602 to turn the second FET 102 OFF, 0 V is applied to first through third gates 52A through 52C of the second FET 102 and 2.5 V, which is the difference between 3 V applied to the first control terminal 601 and the forward turn-on voltage of 0.5 V of the level shift diode 151, is applied to first and second biasing gates 62A and 62B of the second FET 102.

Accordingly, the first through third gates 52A through 52C of the second FET 102 are reverse biased, so that depletion layers 18 expand under the first through third gates 52A through 52C as shown in FIG. 14A. As a result, the isolation is enhanced and the harmonic distortion is reduced.

On the other hand, when 0 V is applied to the first control terminal 601 and 3 V is applied to the second control terminal 602 to turn the second FET 102 ON, 3 V is applied to the first through third gates 52A through 52C of the second FET 102 and 2.5 V, which is the difference between 3 V applied to the second control terminal 602 and the forward turn-on voltage of 0.5 V of the level shift diode 152, is applied to the first and second biasing gates 62A and 62B of the second FET 102.

In this manner, the voltage applied to the first and second biasing gates 62A and 62B of the second FET 102 is slightly lower than 3 V, which is the high-level voltage, so that the first through third gates 52A through 52C of the second FET 102 are forward biased. Accordingly, no depletion layers are formed under the first through third gates 52A through 52C as shown in FIG. 14B, thus reducing the ON resistance.

In this modified example, diodes whose forward turn-on voltages are 0.5 V are used as the level shift diodes 151 and 152. Alternatively, diodes including biasing gates to which a voltage in the range from 80% to 90%, both inclusive, of the high-level voltage are allowed to be applied may be used.

Embodiment 3

Figure 15:
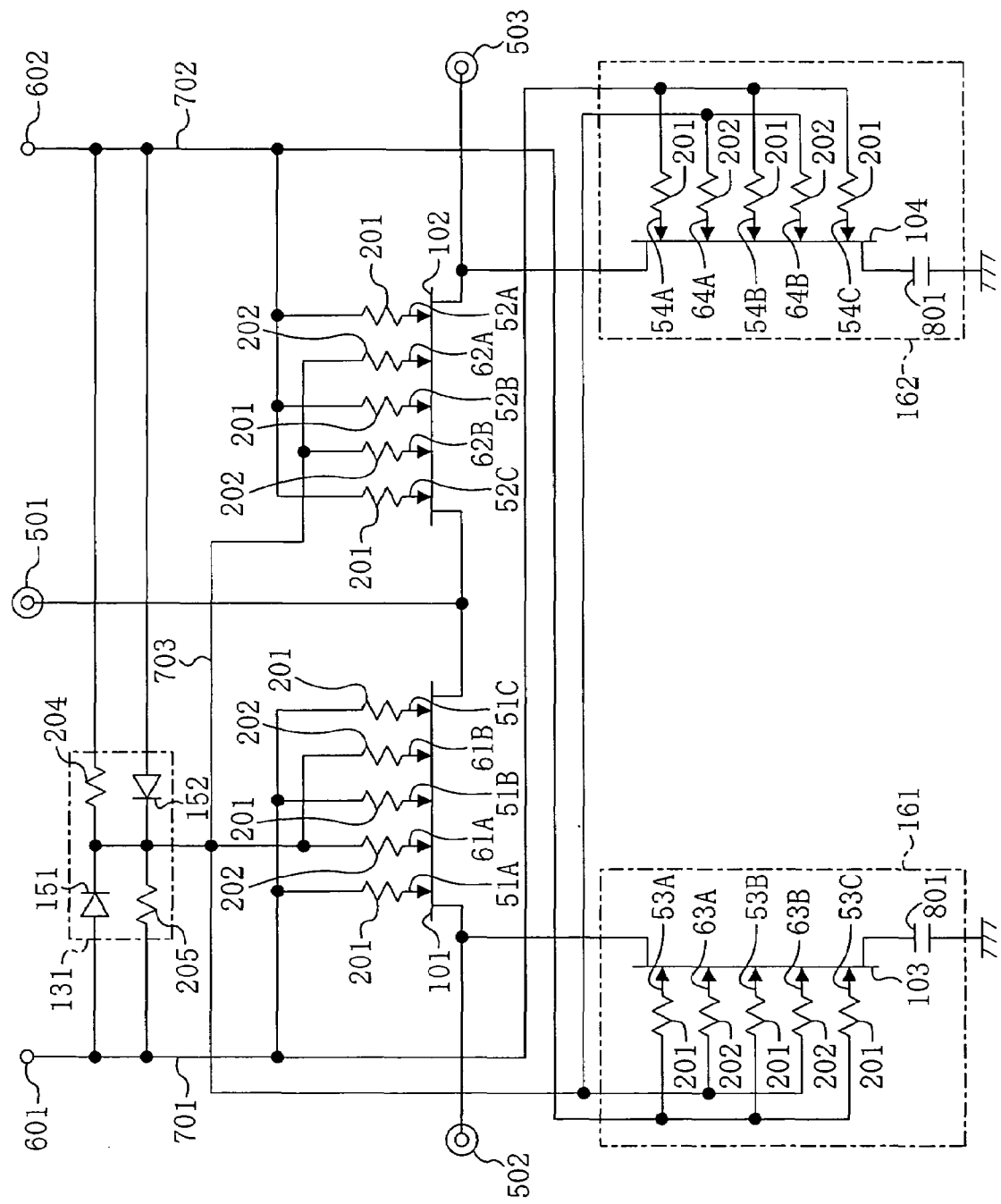
FIG. 15 is a circuit diagram illustrating an RF switching circuit according to a third embodiment of the present invention.

Hereinafter, a third embodiment of the present invention will be described with reference to the drawings. FIG. 15 illustrates an equivalent circuit of an RF switching circuit according to this embodiment. In FIG. 15, components already shown in FIG. 12 are denoted by the same reference numerals, and descriptions thereof will be omitted.

As shown in FIG. 15, in this embodiment, a shunt circuit 161 including a third FET 103 having three gates and two biasing gates and a shunt circuit 162 including a fourth FET 104 having three gates and two biasing gates are provided between a second input/output terminal 502 and a ground and between a third input/output terminal 503 and a ground, respectively.

The third FET 103 has first through third gates 53A through 53C that are connected to a second control line 702 via respective resistors 201. The fourth FET 104 has first through third gates 54A through 54C that are connected to a first control line 701 via respective resistors 201. The third FET 103 has a first biasing gate 63A and a second biasing gate 63B. The fourth FET 104 has a first biasing gate 64A and a second biasing gate 64B. The first and second biasing gates 63A and 63B and the first and second biasing gates 64A and 64B are connected to a biasing line 703 via respective resistors 202.

The drains of the third FET 103 and the fourth FET 104 are grounded via respective capacitors 801 so as to allow the second input/output terminal 502 and the third input/output terminal 503 to be grounded with respect to an RF signal.

Now, it will be described how the RF switching circuit of this embodiment operates in a case where an RF signal input to the second input/output terminal 502 is output from the first input/output terminal 501. In this embodiment, it is assumed that a high-level voltage applied to the gates to turn the first through fourth FETs 101 through 104 ON is 3 V, which is equal to a power supply voltage, and a low-level voltage applied to the gates to turn these FETs OFF is 0 V, which is equal to a ground voltage.

In the case where a signal input to the second input/output terminal 502 is output from the first input/output terminal 501, 3 V is applied to the first control terminal 601 and 0 V is applied to the second control terminal 602. Accordingly, 3 V is applied to the first through third gates 51A through 51C of the first FET 101 and the first through third gates 54A through 54C of the fourth FET 104 and 0 V is applied to the first through third gates 52A through 52C of the second FET 102 and the first through third gates 53A through 53C of the third FET 103.

In addition, 2.5 V, which is the difference between 3 V applied to the first control terminal 601 and a turn-on voltage of 0.5 V of a level shift diode 151, is applied to the biasing line 703, so that 2.5 V is applied to first and second biasing gates 61A and 61B of the first FET 101, first and second biasing gates 62A and 62B of the second FET 102, the first and second biasing gates 63A and 63B of the third FET 103, and the first and second biasing gates 64A and 64B of the fourth FET 104.

This shows that the insertion loss in the first FET 101 and the fourth FET 104 in ON states is reduced, the isolation in the second FET 102 and the third FET 103 in OFF states is enhanced and the distortion in the second FET 102 and the third FET 103 in the OFF states is reduced.

In addition, since the third input/output terminal 503 is grounded with respect to an RF signal by the shunt circuit 162, the isolation between the first input/output terminal 501 and the third input/output terminal 503 is further enhanced.

In this embodiment, the RF switching circuit of the second modified example of the second embodiment is combined with the shunt circuits. Alternatively, the RF switching circuit of the second embodiment or the first modified example of the second embodiment may be combined with the shunt circuits.

In the first through third embodiments and their modified examples, descriptions have been given on the case where an RF signal input to the second input/output terminal 502 is output from the first input/output terminal 501. However, the same advantages are also obtained in a case where an RF signal input to the third input/output terminal 503 is output from the first input/output terminal 501. The same holds true for a case where input and output are replaced with each other. In the foregoing embodiments and modified examples, multi-gate FETs each having three gates are used. Alternatively, the same advantages are obtained as long as a multi-gate FET having two or more gates is used.

Embodiment 4

Figure 16:
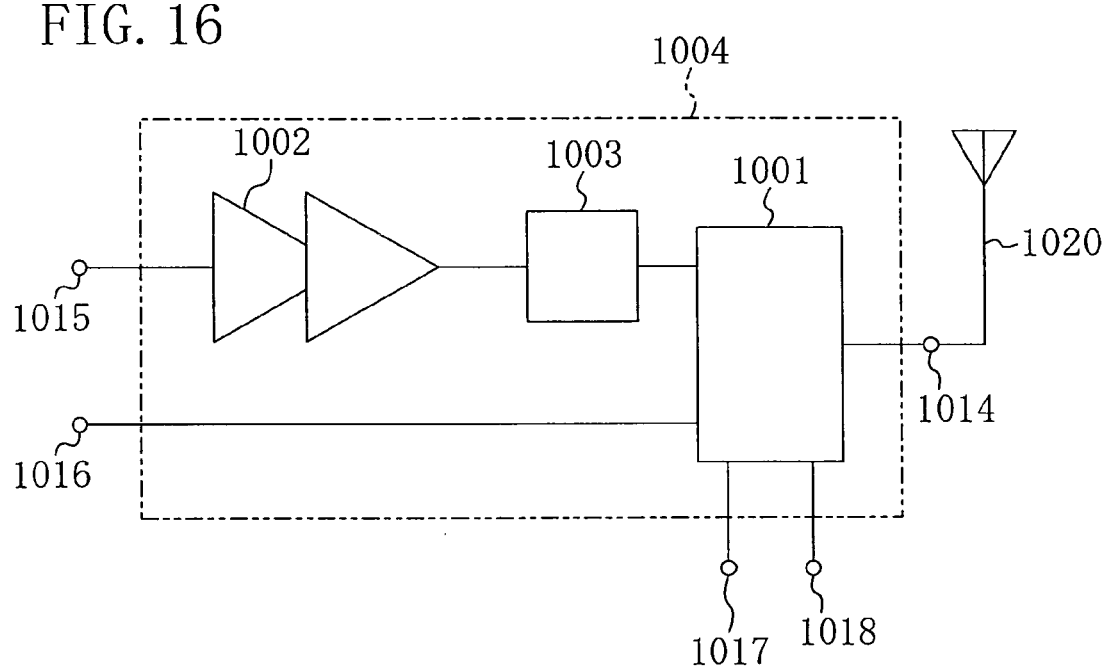
FIG. 16 is block diagram illustrating a semiconductor device according to a fourth embodiment of the present invention.
Figure 17:
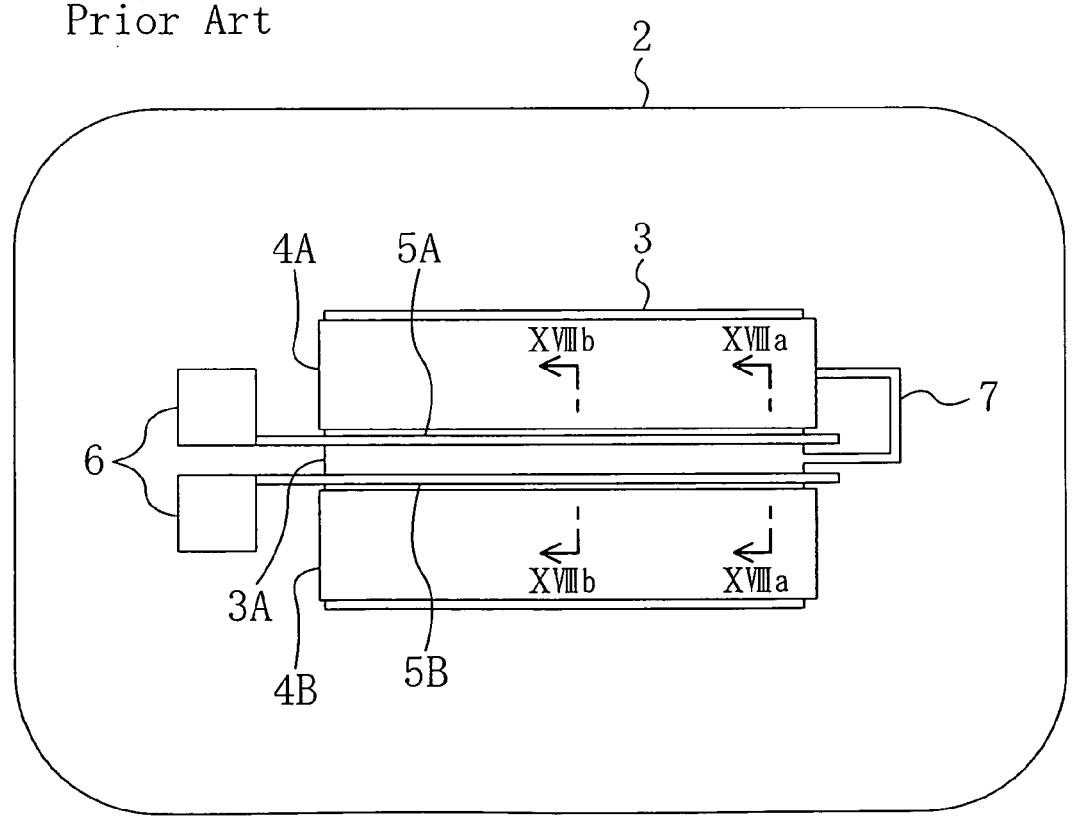
FIG. 17 is a plan view illustrating a semiconductor substrate on which an RF switching circuit according to a conventional example is integrated.
Figure 18A:
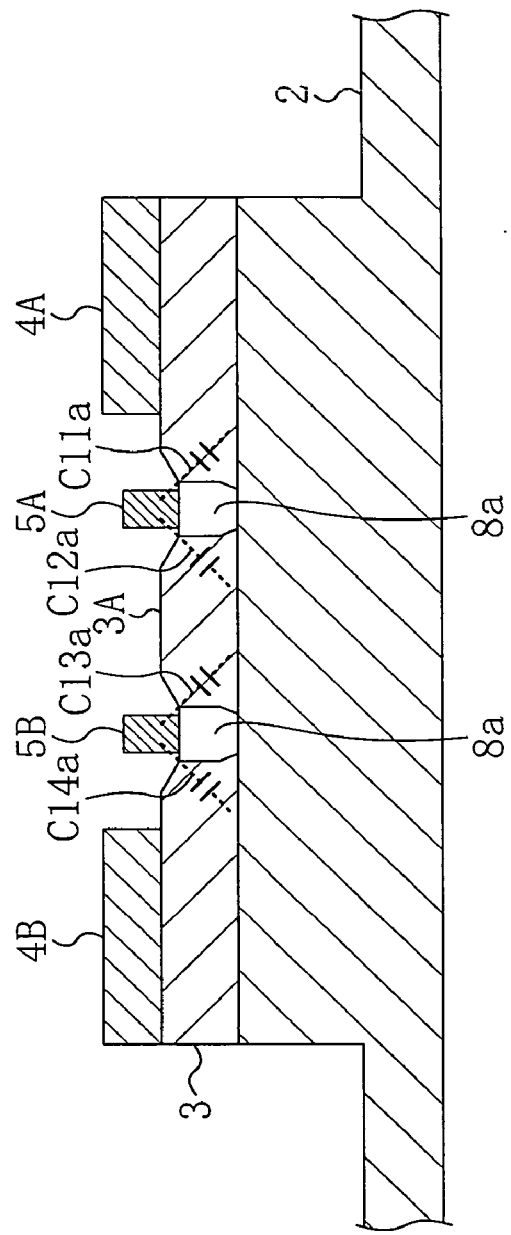
FIGS. 18A and 18B illustrate a semiconductor substrate on which the RF switching circuit of the conventional example is integrated.
Figure 18B:
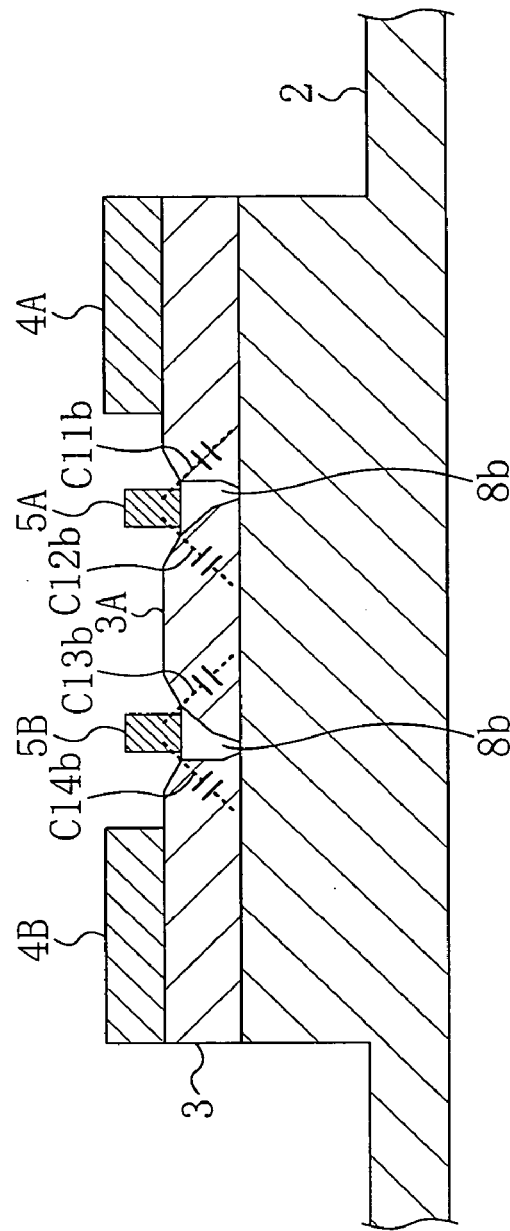

Hereinafter, a fourth embodiment of the present invention will be described with reference to the drawings. FIG. 16 is a block diagram illustrating a semiconductor device including an RF switching circuit according to this embodiment. As shown in FIG. 16, a semiconductor device 1004 includes an RF switching circuit 1001 according to the second modified example of the second embodiment and an RF amplifier 1002. The RF switching circuit 1001 and the RF amplifier 1002 are connected to each other via a matching circuit 1003. The RF switching circuit 1001 is connected to an antenna terminal 1014, an output terminal 1016, a first control terminal 1017 and a second control terminal 1018. The RF amplifier 1002 is connected to an input terminal 1015. The antenna terminal 1014 is connected to an antenna 1020.

Now, operation of the semiconductor device of this embodiment will be described. At transmission, a high-level voltage is applied to the first control terminal 1017 and a low-level voltage is applied to the second control terminal 1018. This makes the antenna terminal 1014 and the input terminal 1015 conducting with respect to an RF signal and isolates the antenna terminal 1014 and the output terminal 1016 from each other with respect to an RF signal. Accordingly, an RF signal input from the input terminal 1015 is amplified by the RF amplifier 1002 and output from the antenna 1020 by way of the matching circuit 1003 and the RF switching circuit 1001.

At reception, the low-level voltage is applied to the first control terminal 1017 and the high-level voltage is applied to the second control terminal 1018 in the manner opposite to that at transmission, so that an RF signal input to the antenna 1020 is output from the output terminal 1015 by way of the RF switching circuit 1001.

In this manner, the RF switching circuit of the present invention exhibiting excellent isolation, the matching circuit and the RF amplifier are provided in the same semiconductor device, so that a semiconductor device for RF signals having a small size and exhibiting excellent isolation between a transmission circuit and a reception circuit is obtained. In addition, a loss in a connection part is reduced, so that the power efficiency of the RF amplifier is improved, resulting in achievement of an RF circuit with low power consumption.

In this embodiment, the RF switching circuit of the second modified example of the second embodiment is used. However, the same advantages are obtained when the RF switching circuits of the other embodiments and modified examples are used.

In the foregoing embodiments and modified examples, a power supply voltage is used as a high-level voltage and a ground voltage is used as a low level voltage. However, the high-level voltage only needs to be a voltage enough to turn a FET ON, and the low-level voltage only needs to be a voltage enough to turn a FET OFF.

As described above, with the switching circuits and semiconductor devices according to the present invention, isolation does not deteriorate and harmonic distortion does not increase with respect to an RF signal and an RF switching circuit having a small insertion loss in an ON state is achieved even when a multi-gate FET is used. Accordingly, these switching circuits and semiconductor devices are effective as those for switching signals in mobile communication equipment, for example.

What is claimed is:

1. An RF switching circuit, comprising:
   a plurality of input/output terminals for inputting and outputting an RF signal;
   a switch for opening and closing an electrical connection between the input/output terminals, and
   a control line,
   wherein the switch is constituted by a multi-gate field effect transistor including a plurality of gates located between source and drain spaced from each other on a semiconductor layer,
   the number of said input/output terminals is three,
   the RF switching circuit is an SPDT RF switching circuit including two said multi-gate field effect transistors each connected between each two of the input/output terminals,
   a bias voltage is applied to an inter-gate region of the semiconductor layer between the gates,
   the bias voltage is equal to or lower than 90% of a high-level voltage, which is a voltage for turning the multi-gate field effect transistor ON, in a state where the multi-gate field effect transistor is ON, and is equal to or higher than 80% of the high-level voltage and equal to or lower than the high-level voltage in a state where the multi-gate field effect transistor is OFF, and
   the control line is connected between the gates of one of the multi-gate field effect transistors and the inter-gate region of the other multi-gate field effect transistor.

2. The RF switching circuit of claim 1, further comprising a diode provided between the control line and the inter-gate region, the diode having a cathode connected to the inter-gate region.

3. The RF switching circuit of claim 1, wherein the high-level voltage is a power supply voltage.

* * * * *